United States Patent
Kwon et al.

(10) Patent No.: US 11,091,690 B2
(45) Date of Patent: Aug. 17, 2021

(54) QUANTUM DOTS, A COMPOSITION OR COMPOSITE INCLUDING THE SAME, AND AN ELECTRONIC DEVICE INCLUDING THE SAME

(71) Applicant: SAMSUNG ELECTRONICS CO., LTD., Suwon-si (KR)

(72) Inventors: Soo Kyung Kwon, Suwon-si (KR); Yong Wook Kim, Yongin-si (KR); Jihyun Min, Seoul (KR); Eun Joo Jang, Suwon-si (KR)

(73) Assignee: SAMSUNG ELECTRONICS CO., LTD., Gyeonggi-do (KR)

( * ) Notice: Subject to any disclaimer, the term of this patent is extended or adjusted under 35 U.S.C. 154(b) by 232 days.

(21) Appl. No.: 16/431,772

(22) Filed: Jun. 5, 2019

(65) Prior Publication Data

US 2019/0367804 A1 Dec. 5, 2019

(30) Foreign Application Priority Data

Jun. 5, 2018 (KR) .................. 10-2018-0065098

(51) Int. Cl.
*C09K 11/02* (2006.01)
*C09K 11/62* (2006.01)
(Continued)

(52) U.S. Cl.
CPC .......... *C09K 11/025* (2013.01); *C09K 11/623* (2013.01); *G02F 1/133615* (2013.01);
(Continued)

(58) Field of Classification Search
CPC ..... C09K 11/025; C09K 11/623; B82Y 20/00; B82Y 40/00; G02F 1/133615; G02F 1/133617; G02F 1/133614; G02F 2202/36
See application file for complete search history.

(56) References Cited

U.S. PATENT DOCUMENTS

| | | | |
|---|---|---|---|
| 7,374,807 B2 | 5/2008 | Parce et al. | |
| 7,588,828 B2 * | 9/2009 | Mushtaq | C01B 25/082 427/212 |

(Continued)

FOREIGN PATENT DOCUMENTS

| | | |
|---|---|---|
| CN | 103215034 A | 7/2013 |
| CN | 106010535 A | 10/2016 |

(Continued)

OTHER PUBLICATIONS

Jie Wang et al., "Quaternary Alloy Quantum Dots with Widely Tunable Emission—A Versatile System to Fabricate the Dual-Emission Nanocomposites for Bio-Imaging," RSC Advances, The Royal Society of Chemistry, May 26, 2016, pp. 1-9.
(Continued)

*Primary Examiner* — C Melissa Koslow
(74) *Attorney, Agent, or Firm* — Cantor Colburn LLP

(57) ABSTRACT

A quantum dot including a core including a quaternary alloy semiconductor nanocrystal and not including cadmium, a composition and a quantum dot polymer composite including the same, and an electronic device including the same. The quaternary alloy semiconductor nanocrystal comprises indium (In), phosphorous (P), zinc (Zn), and selenium (Se), and in the core, a ratio of the zinc with respect to the indium is less than or equal to about 0.5:1 and in the core, a ratio of selenium with respect to zinc is less than or equal to about 0.6:1.

32 Claims, 9 Drawing Sheets

(51) Int. Cl.
  *H01L 51/50*     (2006.01)
  *G02F 1/13357*   (2006.01)
  *B82Y 20/00*     (2011.01)
  *B82Y 40/00*     (2011.01)
  *G02F 1/1335*    (2006.01)

(52) U.S. Cl.
  CPC ...... *G02F 1/133617* (2013.01); *H01L 51/502* (2013.01); *B82Y 20/00* (2013.01); *B82Y 40/00* (2013.01); *G02F 1/133614* (2021.01); *G02F 2202/36* (2013.01)

(56) References Cited

U.S. PATENT DOCUMENTS

| | | |
|---|---|---|
| 7,645,397 B2 | 1/2010 | Parce et al. |
| 7,819,539 B2 | 10/2010 | Kim et al. |
| 8,425,803 B2 | 4/2013 | Parce et al. |
| 8,592,037 B2 | 11/2013 | Parce et al. |
| 8,749,130 B2 | 6/2014 | Parce et al. |
| 9,478,700 B2 * | 10/2016 | Daniels .................... B01J 2/003 |
| 9,620,686 B2 * | 4/2017 | Steckel ................... H01L 33/04 |
| 9,666,768 B2 | 5/2017 | Daniels et al. |
| 9,701,901 B2 | 7/2017 | Kang et al. |
| 2008/0020235 A1 | 1/2008 | Parce et al. |
| 2016/0200974 A1 | 7/2016 | Smith et al. |
| 2017/0009134 A1 | 1/2017 | Daniels et al. |
| 2017/0229618 A1 | 8/2017 | Daniels et al. |

FOREIGN PATENT DOCUMENTS

| | | |
|---|---|---|
| CN | 106701059 A | 5/2017 |
| JP | 2017513960 | 6/2017 |
| KR | 20090038022 A | 4/2009 |
| KR | 20170018468 A | 2/2017 |
| KR | 101729084 B1 | 5/2017 |
| KR | 20170097825 A | 8/2017 |

OTHER PUBLICATIONS

Taehoon Kim et al., "Large-Scale Synthesis of InPZnS Alloy Quantum Dots with Dodecanethiol as a Composition Controller," The Journal of Physical Chemistry Letters, Dec. 26, 2011, pp. 214-218, vol. 3.

* cited by examiner

Pattern Preparation by using a photoresist

Repeating the Patterning Process three times

FIG. 6

| Anode (e.g., Ag and the like) |
|---|
| Hole auxiliary layer (e.g., HTL) |
| Emissive layer |
| Electron auxiliary layer (e.g., ETL) |
| Transparent electrode (e.g., ITO cathode) |
| Transparent substrate |

QUANTUM DOTS, A COMPOSITION OR COMPOSITE INCLUDING THE SAME, AND AN ELECTRONIC DEVICE INCLUDING THE SAME

CROSS-REFERENCE TO RELATED APPLICATION

This application claims priority to and the benefit of Korean Patent Application No. 10-2018-0065098, filed in the Korean Intellectual Property Office on Jun. 5, 2018, and all the benefits accruing therefrom under 35 U.S.C. § 119, the content of which is incorporated herein in its entirety by reference.

BACKGROUND

1. Field

Quantum dots, a composition or composite including same, and an electronic device including the same are disclosed.

2. Description of the Related Art

Unlike a bulk material, quantum dots (e.g., nano-sized semiconductor nanocrystals) may have different energy bandgaps by controlling the sizes and compositions of the quantum dots. Quantum dots may exhibit electroluminescent and photoluminescent properties. In a colloidal synthesis, organic materials such as a dispersing agent may coordinate, e.g., be bound, to a surface of the semiconductor nanocrystal during the crystal growth thereof, thereby providing a quantum dot having a controlled size and having luminescent properties. From an environmental standpoint, developing a cadmium free quantum dot with improved luminescent properties is desirable.

SUMMARY

An embodiment provides cadmium free quantum dots that may exhibit improved photoluminescence properties and enhanced stability.

An embodiment provides a method of producing the cadmium free quantum dots.

An embodiment provides a composition including the cadmium free quantum dot.

An embodiment provides a quantum dot-polymer composite including cadmium free quantum dot.

An embodiment provides a layered structure and an electronic device including the quantum dot-polymer composite.

In an embodiment, a quantum dot includes a core including a quaternary alloy semiconductor nanocrystal, wherein the quantum dot does not include cadmium, wherein the quaternary alloy semiconductor nanocrystal includes indium (In), phosphorous (P), zinc (Zn), and selenium (Se), and in the core, a mole ratio of the zinc with respect to the indium is less than or equal to about 0.5:1 and in the core, a mole ratio of selenium with respect to zinc is less than or equal to about 0.6:1.

In the core, the mole ratio of zinc with respect to indium may be less than or equal to about 0.45:1 and in the core, and the mole ratio of selenium with respect to zinc may be less than or equal to about 0.51:1.

The core may have a first absorption peak wavelength of less than or equal to about 460 nanometers (nm) in an ultraviolet-visible (UV-Vis) absorption spectrum of the core.

The quaternary alloy semiconductor nanocrystal may include a homogeneous alloy.

The core may have a size of greater than or equal to about 2 nm and less than or equal to about 3 nm.

In the core, a mole ratio of a total sum of the zinc and the selenium with respect to a total sum of the indium and the phosphorous may be greater than or equal to about 0.2:1, or greater than or equal to about 0.3:1 and less than or equal to about 0.65:1, or less than or equal to about 0.5:1.

The quantum dot may have a semiconductor nanocrystal shell on (e.g., directly on) the core and the semiconductor nanocrystal shell may include zinc, selenium, and sulfur.

The semiconductor nanocrystal shell may include a first layer disposed directly on the core and a second layer disposed on the first layer, the first layer including a first semiconductor nanocrystal, and the second layer including a second semiconductor nanocrystal having a composition different from a composition of the first semiconductor nanocrystal.

An energy bandgap of the second semiconductor nanocrystal may be greater than or equal to an energy bandgap of the first semiconductor nanocrystal.

The first semiconductor nanocrystal may include zinc, selenium, and optionally sulfur.

The second semiconductor nanocrystal may include zinc and sulfur. The second semiconductor nanocrystal may not include selenium.

A thickness of the first layer may be greater than or equal to about 3 monolayers.

A thickness of the first layer may be less than or equal to about 10 monolayers.

The second layer may be an outermost layer of the quantum dot.

A thickness of the second layer may be greater than or equal to about 1 monolayer.

A thickness of the second layer may be less than or equal to about 10 monolayers.

A maximum photoluminescence peak of the quantum dot may be in a range of from about 500 nm to about 580 nm.

A maximum photoluminescence peak of the quantum dot may have a full width at half maximum of less than or equal to about 45 nm.

A quantum efficiency of the quantum dot may be greater than or equal to about 70%.

In an embodiment, a method of producing the quantum dot includes:

preparing a reaction liquid including an organic ligand, an indium precursor, a zinc precursor, a selenium precursor, and a phosphorous precursor in an organic solvent; and conducting a reaction in the reaction liquid at a temperature of about greater than or equal to about 290° C. for a time period of less than or equal to about 1 hour to obtain a core including a quaternary alloy semiconductor nanocrystal (hereinafter, also referred to as an alloy core) and produce the quantum dot.

Preparing the reaction liquid may include mixing the indium precursor and the zinc precursor in the organic solvent in the presence of the organic ligand to obtain a mixture; heating the mixture at a temperature of about 150° C. and 220° C. to obtain a heated mixture; and adding the selenium precursor and the phosphorous precursor to the heated mixture.

The reaction liquid may not include an alkyl thiol.

The method may further include forming a semiconductor nanocrystal shell on the alloy core.

In an embodiment, a composition includes the aforementioned quantum dot, a dispersing agent (e.g., a carboxylic acid group containing binder polymer), a photopolymerizable monomer including a carbon-carbon double bond, a photoinitiator, and a solvent (e.g., an organic solvent).

The binder polymer may include a carboxylic acid group containing binder polymer, which includes:

a copolymer of a monomer mixture including a first monomer including a carboxylic acid group and a carbon-carbon double bond, a second monomer including a carbon-carbon double bond and a hydrophobic moiety and not including a carboxylic acid group, and optionally a third monomer including a carbon-carbon double bond and a hydrophilic moiety and not including a carboxylic acid group;

a multiple aromatic ring-containing polymer having a backbone structure in which two aromatic rings are bound to a quaternary carbon atom that is a constituent atom of another cyclic moiety in a main chain of the backbone structure, the multiple aromatic ring-containing polymer including a carboxylic acid group (—COOH);

or a combination thereof.

The carboxylic acid containing binder polymer may have an acid value of greater than or equal to about 50 milligrams of potassium hydroxide (KOH) per gram (mg KOH/g) and less than or equal to about 240 mg KOH/g.

The composition may further include a (multiple or mono-functional) thiol compound including a thiol group at a terminal end of the thiol compound, a metal oxide particulate, or a combination thereof.

When a plurality of metal oxide particles is present, the plurality of metal oxide particles may include $TiO_2$, $SiO_2$, $BaTiO_3$, $Ba_2TiO_4$, ZnO, or a combination thereof.

The thiol compound may include a compound represented by Chemical Formula 1:

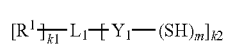

Chemical Formula 1 wherein, $R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group, wherein —NRR', wherein R and R' are independently hydrogen or C1 to C30 linear or branched alkyl group, but simultaneously not hydrogen; an isocyanate group; a halogen; —ROR', wherein R is a substituted or unsubstituted C1 to C20 alkylene group and R' is hydrogen or a C1 to C20 linear or branched alkyl group; an acyl halide, wherein —RC(=O)X, wherein R is a substituted or unsubstituted alkylene group and X is a halogen; —C(=O)OR', wherein R' is hydrogen or a C1 to C20 linear or branched alkyl group; —CN; —C(=O)NRR', wherein R and R' are independently hydrogen or a C1 to C20 linear or branched alkyl group; —C(=O)ONRR', wherein R and R' are independently hydrogen or a C1 to C20 linear or branched alkyl group; or a combination thereof, $L_1$ is a carbon atom, a substituted or unsubstituted C1 to C30 alkylene group, a substituted or unsubstituted C1 to C30 alkylene group wherein a methylene (—$CH_2$—) is replaced by a sulfonyl (—$SO_2$—) moiety, a carbonyl (CO) moiety, an ether (—O—) moiety, a sulfide (—S—) moiety, a sulfoxide (—SO—) moiety, an ester (—C(=O)O—) moiety, an amide (—C(=O)NR—) moiety (wherein R is hydrogen or a C1 to C10 alkyl group), or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group, $Y_1$ is a single bond; a substituted or unsubstituted C1 to C30 alkylene group; a substituted or unsubstituted C2 to C30 alkenylene group; or a substituted or unsubstituted C1 to C30 alkylene group or a substituted or unsubstituted C2 to C30 alkenylene group wherein a methylene (—$CH_2$—) is replaced by a sulfonyl (—S(=O)$_2$—) moiety, a carbonyl (—C(=O)—) moiety, an ether (—O—) moiety, a sulfide (—S—) moiety, a sulfoxide (—S(=O)—) moiety, an ester ('C(=O)O—) moiety, an amide (—C(=O)NR—) moiety (wherein R is hydrogen or a C1 to C10 linear or branched alkyl group), an imine moiety (—NR—) (wherein R is hydrogen or a C1 to C10 linear or branched alkyl group), or a combination thereof, m is an integer of 1 or greater, k1 is 0 or an integer of 1 or greater, k2 is an integer of 1 or greater, and a sum of m and k2 is an integer of 3 or greater, provided that m does not exceed the valence of $Y_1$ and a sum of k1 and k2 does not exceed the valence of $L_1$.

In an embodiment, a quantum dot polymer composite includes a polymer matrix; and the aforementioned quantum dot in the polymer matrix.

The polymer matrix may include a crosslinked polymer, a binder polymer including a carboxylic acid group, or a combination thereof.

The polymer matrix may include a binder polymer, a polymerization product of a photopolymerizable monomer including at least carbon-carbon double bond, a polymerization product of the photopolymerizable monomer and a multi-thiol compound including thiol groups at its terminal end, i.e., at a terminal end of the multi-thiol compound, or a combination thereof.

In an embodiment, a display device includes a light source and a light emitting element, wherein the light emitting element includes the aforementioned quantum dot-polymer composite and the light source is configured to provide the light emitting element with incident light.

The incident light may have a luminescence peak wavelength of about 440 nanometers to about 460 nanometers.

In an embodiment, the light emitting element may include a sheet including the quantum dot polymer composite.

In an embodiment, the light emitting element may include a stacked structure including a substrate and a light emitting layer disposed on the substrate, wherein the light emitting layer includes a pattern of the quantum dot polymer composite and the pattern includes a repeating section configured to emit light at a predetermined wavelength.

The pattern may include a first section configured to emit first light and a second section configured to emit a second light having a center wavelength that is different from a center wavelength of the first light.

An embodiment provides an electronic device including the quantum dot.

The electronic device may include a light emitting diode (LED), an organic light emitting diode (OLED), a sensor, a solar cell, an imaging sensor, or a liquid crystal display (LCD), but is not limited thereto.

Quantum dots of an embodiment may exhibit improved luminous properties together with enhanced stability. A composition including the aforementioned quantum dots may provide improved processability. The quantum dots may find uses in various display devices and biological labelling (e.g., bio sensor, bio imaging, etc.), a photo detector, a solar cell, a hybrid composite, or the like.

BRIEF DESCRIPTION OF THE DRAWINGS

These and/or other aspects will become apparent and more readily appreciated from the following description of the embodiments, taken in conjunction with the accompanying drawings in which:

FIG. 6 is a schematic cross-sectional view showing an electroluminescent device according to an embodiment.

DETAILED DESCRIPTION

Figure 1A:
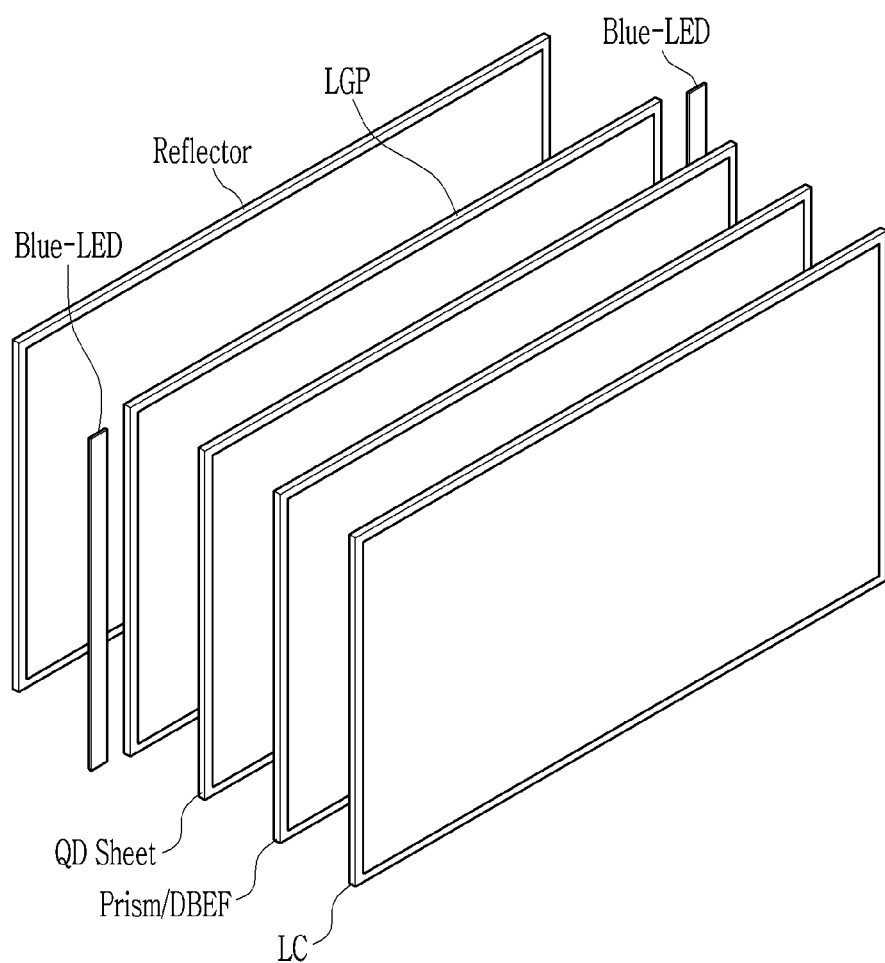
FIG. 1A is an exploded view of a display device according to an embodiment.

Advantages and characteristics of this disclosure, and a method for achieving the same, will become evident referring to the following example embodiments together with the drawings attached hereto. However, the embodiments should not be construed as being limited to the embodiments set forth herein. If not defined otherwise, all terms (including technical and scientific terms) in the specification may be defined as commonly understood by one skilled in the art. The terms defined in a generally-used dictionary may not be interpreted ideally or exaggeratedly unless clearly defined. In addition, unless explicitly described to the contrary, the word "comprise" and variations such as "comprises" or "comprising", will be understood to imply the inclusion of stated elements but not the exclusion of any other elements.

Further, the singular includes the plural unless mentioned otherwise.

In the drawings, the thickness of layers, films, panels, regions, etc., are exaggerated for clarity. Like reference numerals designate like elements throughout the specification.

It will be understood that when an element such as a layer, film, region, or substrate is referred to as being "on" another element, it can be directly on the other element or intervening elements may also be present. In contrast, when an element is referred to as being "directly on" another element, there are no intervening elements present.

"About" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±10% or 5% of the stated value.

It will be understood that, although the terms "first," "second," "third" etc. may be used herein to describe various elements, components, regions, layers and/or sections, these elements, components, regions, layers and/or sections should not be limited by these terms. These terms are only used to distinguish one element, component, region, layer, or section from another element, component, region, layer, or section. Thus, "a first element," "component," "region," "layer," or "section" discussed below could be termed a second element, component, region, layer, or section without departing from the teachings herein.

Furthermore, relative terms, such as "lower" and "upper," may be used herein to describe one element's relationship to another element as illustrated in the Figures. It will be understood that relative terms are intended to encompass different orientations of the device in addition to the orientation depicted in the Figures. For example, if the device in one of the figures is turned over, elements described as being on the "lower" side of other elements would then be oriented on "upper" sides of the other elements. The exemplary term "lower," can therefore, encompasses both an orientation of "lower" and "upper," depending on the particular orientation of the figure. Similarly, if the device in one of the figures is turned over, elements described as "below" other elements would then be oriented "above" the other elements. The exemplary terms "below" can, therefore, encompass both an orientation of above and below.

Exemplary embodiments are described herein with reference to cross section illustrations that are schematic illustrations of idealized embodiments. As such, variations from the shapes of the illustrations as a result, for example, of manufacturing techniques and/or tolerances, are to be expected. Thus, embodiments described herein should not be construed as limited to the particular shapes of regions as illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present claims.

As used herein, unless a definition is otherwise provided, the term "substituted" refers to a compound or a group or a moiety wherein at least one hydrogen atom thereof is substituted with a substituent. The substituent may include a C1 to C30 alkyl group, a C2 to C30 alkenyl group, a C2 to C30 alkynyl group, a C6 to C30 aryl group, a C7 to C30 alkylaryl group, a C1 to C30 alkoxy group, a C1 to C30 heteroalkyl group, a C3 to C30 heteroalkylaryl group, a C3 to C30 cycloalkyl group, a C3 to C15 cycloalkenyl group, a C6 to C30 cycloalkynyl group, a C2 to C30 heterocycloalkyl group, a halogen (—F, —Cl, —Br, or —I), a hydroxy group (—OH), a nitro group (—NO$_2$), a cyano group (—CN), an amino group (—NRR', wherein R and R' are the same or different, and are independently hydrogen or a C1 to C6 alkyl group), an azido group (—N$_3$), an amidino group (—C(=NH)NH$_2$), a hydrazino group (—NHNH$_2$), a hydrazono group (=N(NH$_2$)), an aldehyde group (—C(=O)H), a carbamoyl group (—C(O)NH$_2$), a thiol group (—SH), an ester group (—C(=O)OR, wherein R is a C1 to C6 alkyl group or a C6 to C12 aryl group), a carboxylic acid group (—COOH) or a salt thereof (—C(=O)OM, wherein M is an organic or inorganic cation), a sulfonic acid group (—SO$_3$H) or a salt thereof (—SO$_3$M, wherein M is an organic or inorganic cation), a phosphoric acid group (—PO$_3$H$_2$) or a salt thereof (—PO$_3$MH or —PO$_3$M$_2$, wherein M is an organic or inorganic cation), or a combination thereof.

As used herein, unless a definition is otherwise provided, the term "hetero" means that the compound or group includes at least one (e.g., one to three) heteroatom(s), wherein the heteroatom(s) is each independently N, O, S, Si, P, or a combination thereof.

As used herein, unless a definition is otherwise provided, the term "alkylene group" refers to a straight or branched chain, saturated aliphatic hydrocarbon group having a valence of at least two. The alkylene group may be optionally substituted with one or more substituents.

As used herein, unless a definition is otherwise provided, the term "arylene group" refers to a functional group having a valence of at least two and formed by the removal of at least two hydrogen atoms from one or more rings of an aromatic hydrocarbon, wherein the hydrogen atoms may be removed from the same or different rings (preferably different rings), each of which rings may be aromatic or nonaromatic. The arylene group may be optionally substituted with one or more substituents.

As used herein, unless a definition is otherwise provided, the term "aliphatic hydrocarbon group" refers to a C1 to C30 linear or branched alkyl group, a C2 to C30 linear or branched alkenyl group, or C2 to C30 linear or branched alkynyl group, the term "aromatic hydrocarbon group" refers to a C6 to C30 aryl group or a C2 to C30 heteroaryl group, and the term "alicyclic hydrocarbon group" refers to a C3 to C30 cycloalkyl group, a C3 to C30 cycloalkenyl group, or a C3 to C30 cycloalkynyl group.

As used herein, unless a definition is otherwise provided, the term "(meth)acrylate" refers to acrylate, and/or methacrylate, or a combination thereof. The (meth)acrylate may include a (C1 to C10 alkyl)acrylate, a (C1 to C10 alkyl)methacrylate, or a combination thereof.

As used herein, unless a definition is otherwise provided, "alkoxy" means an alkyl group that is linked via an oxygen (i.e., alkyl-O—), for example methoxy, ethoxy, and sec-butyloxy groups.

As used herein, unless a definition is otherwise provided, "alkyl" means a straight or branched chain, saturated, monovalent hydrocarbon group (e.g., methyl or hexyl).

As used herein, unless a definition is otherwise provided, "alkynyl" means a straight or branched chain, monovalent hydrocarbon group having at least one carbon-carbon triple bond (e.g., ethynyl).

As used herein, unless a definition is otherwise provided, "amine group" has the general formula —NRR, wherein each R is independently hydrogen, a C1-C12 alkyl group, a C7-C20 alkylarylene group, a C7-C20 arylalkylene group, or a C6-C18 aryl group.

As used herein, unless a definition is otherwise provided, "arene" means a hydrocarbon having an aromatic ring, and includes monocyclic and polycyclic hydrocarbons wherein the additional ring(s) of the polycyclic hydrocarbon may be aromatic or nonaromatic. Specific arenes include benzene, naphthalene, toluene, and xylene.

As used herein, unless a definition is otherwise provided, "aromatic" means an organic compound or group comprising at least one unsaturated cyclic group having delocalized pi electrons. The term encompasses both hydrocarbon aromatic compounds and heteroaromatic compounds.

As used herein, unless a definition is otherwise provided, "aryl" means a monovalent group formed by the removal of one hydrogen atom from one or more rings of an arene (e.g., phenyl or naphthyl).

As used herein, unless a definition is otherwise provided, "arylalkyl" means a substituted or unsubstituted aryl group covalently linked to an alkyl group that is linked to a compound (e.g., a benzyl is a C7 arylalkyl group).

As used herein, unless a definition is otherwise provided, "cycloalkenyl" means a monovalent group having one or more rings and one or more carbon-carbon double bond in the ring, wherein all ring members are carbon (e.g., cyclopentyl and cyclohexyl).

As used herein, unless a definition is otherwise provided, "cycloalkyl" means a monovalent group having one or more saturated rings in which all ring members are carbon (e.g., cyclopentyl and cyclohexyl).

As used herein, unless a definition is otherwise provided, "cycloalkynyl" means a stable aliphatic monocyclic or polycyclic group having at least one carbon-carbon triple bond, wherein all ring members are carbon (e.g., cyclohexynyl).

As used herein, unless a definition is otherwise provided, "ester" refers to a group of the formula —O(C=O)Rx or a group of the formula —(C=O)ORx wherein Rx is C1 to C28 aromatic organic group or aliphatic organic group. An ester group includes a C2 to C30 ester group, and specifically a C2 to C18 ester group.

As used herein, unless a definition is otherwise provided, "heteroalkyl" is an alkyl group that comprises at least one heteroatom covalently bonded to one or more carbon atoms of the alkyl group. Each heteroatom is independently chosen from nitrogen (N), oxygen (O), sulfur (S), and or phosphorus (P).

As used herein, unless a definition is otherwise provided, "ketone" refers to a C2 to C30 ketone group, and specifically a C2 to C18 ketone group. Ketone groups have the indicated number of carbon atoms, with the carbon of the keto group being included in the numbered carbon atoms. For example a C2 ketone group is an acetyl group having the formula CH3(C=O)—.

In an embodiment, "hydrophobic moiety" may be a moiety that may cause a compound including the same to agglomerate in an aqueous (hydrophilic) solution and to have a tendency to repel water. For example, the hydrophobic moiety may include an aliphatic hydrocarbon group (e.g., alkyl, alkenyl, alkynyl, etc.) having at least one (e.g., at least two, three, four, five, or six, or higher) carbon atoms, an aromatic hydrocarbon group having at least six carbon atoms (e.g., phenyl, naphthyl, arylalkyl group, etc.), or an alicyclic hydrocarbon group having at least five carbon atoms (e.g., cyclohexyl, norbornenyl, etc.).

As used herein, a conversion efficiency (CE) refers to a ratio of emission light amount of a quantum dot polymer composite with respect to a light amount absorbed by the composite from incident light (e.g., blue light). The total light amount (B) of excitation light may be obtained by integration of a photoluminescence (PL) spectrum of the incident light, the PL spectrum of the quantum dot-polymer composite film is measured to obtain a dose (A) of light in a green or red wavelength region emitted from the quantum dot-polymer composite film and a dose (B') of incident light passing through the quantum dot-polymer composite film, and a conversion efficiency is calculated by the following equation:

$$A/(B-B')\times 100\% = \text{photoconversion efficiency (\%)}$$

In an embodiment, the term "dispersion" may refer to a system in which a dispersed phase is a solid and a continuous phase includes a liquid. For example, the term "dispersion" may refer to a colloidal dispersion, wherein the dispersed phase includes particles having a dimension of at least about 1 nm (e.g., at least about 2 nm, at least about 3 nm, or at least about 4 nm) and less than or equal to about several micrometers (μm) (e.g., 2 μm or less, or 1 μm or less or 500 nm or less).

In the specification, the term "Group" in the term Group III, Group II, or the like refers to a group of the Periodic Table of Elements.

As used herein, "Group I" refers to Group IA and Group IB, and may include Li, Na, K, Rb, and Cs but are not limited thereto.

As used herein, "Group II" refers to Group IIA and a Group IIB, and examples of the Group II metal may include Cd, Zn, Hg, and Mg, but are not limited thereto.

As used herein, "Group III" refers to Group IIIA and Group IIIB, and examples of the Group III metal may include Al, In, Ga, and Tl, but are not limited thereto.

As used herein, "Group IV" refers to Group IVA and Group IVB, and examples of the Group IV metal may include Si, Ge, and Sn but are not limited thereto. As used herein, the term "a metal" may include a semi-metal such as Si.

As used herein, "Group V" refers to Group VA and may include nitrogen, phosphorus, arsenic, antimony, and bismuth but is not limited thereto.

As used herein, "Group VI" refers to Group VIA and may include sulfur, selenium, and tellurium, but is not limited thereto.

A semiconductor nanocrystal particle (also referred to as a quantum dot) is a nano-sized crystalline material. The semiconductor nanocrystal particle may have a large surface area per unit volume due to a relatively small size of the semiconductor nanocrystal particle and may exhibit different characteristics from bulk materials having the same composition due to a quantum confinement effect. Quantum dots may absorb light from an excitation source to be excited, and may emit energy corresponding to an energy bandgap of the quantum dots.

The quantum dots have potential applicability in various devices (e.g., an electronic device) due to unique photoluminescence characteristics of the quantum dots. Quantum dots having properties currently applicable to an electronic device are mostly cadmium-based. However, cadmium may cause a serious environment/health problem and thus is a restricted element. As a type of cadmium free quantum dot, a Group III-V-based nanocrystal has been extensively researched. However, cadmium free quantum dots have technological drawbacks in comparison with cadmium based quantum dots. When the cadmium free quantum dots undergo various processes for being applied to an electronic device, the cadmium free quantum dots may exhibit sharply deteriorated luminous properties.

In an embodiment, a quantum dot includes a core including a quaternary alloy semiconductor nanocrystal and the quantum dot does not include cadmium. In an embodiment, the quaternary alloy semiconductor nanocrystal includes indium (In), phosphorous (P), zinc (Zn), and selenium (Se), and in the core, a ratio of the zinc with respect to the indium is less than or equal to about 0.5:1 and in the core, a ratio of selenium with respect to zinc is less than or equal to about 0.6:1.

A UV-Vis absorption spectrum of the core may have a first absorption peak wavelength of less than or equal to about 460 nm. In this specification, the term "first absorption peak" refers to a main excitonic peak appearing first from the longest wavelength region of a UV-Vis absorption spectrum of a quantum dot (i.e., appearing in the lowest energy region in the UV-Vis absorption spectrum).

By having the aforementioned structure and composition, the quantum dot of an embodiment may have an improved shell coating, and thereby, a single quantum dot may show improved stability (e.g., thermal stability) and enhanced optical properties. Introducing, e.g., including, a relatively thick inorganic shell may increase the optical properties and the stability of the quantum dots. For example, when a relatively thick ZnSeS shell is coated on an indium phosphide core, a quantum yield may increase. However, the formation of the thick shell may result in a greater degree of a red-shift of the luminescent wavelength, in order to obtain a quantum dot emitting a green light with improved quantum yield, a core emitting light of a shorter wavelength (e.g., having a small size) may be desired. However, the core having a smaller size may be vulnerable to oxidation and have poor stability. Accordingly, the quantum dot emitting green light may be technologically limited in terms of photoluminescent quantum yield and stability.

The quantum dot of an embodiment includes a quaternary alloy core comprising InPZnSe, thereby having a first absorption peak at a wavelength of less than or equal to about 460 nm even when the core has a relatively increased size. Therefore, disposing a shell of a desired thickness on the aforementioned core makes it possible to provide a green light emitting quantum dot having enhanced luminous properties and stability at the same time.

Without wishing to be bound by any theory, it is believed that by adopting the aforementioned alloy core, the quantum dot of an embodiment may have a desired band gap alignment between the core and the shell and at the same time the lattice mismatch at the interface between the core and the shell may be relieved/reduced and the amount of the phosphorous (P)-dangling bond on a surface of the core may decrease, which can makes it possible to achieve a stable epitaxial growth of the shell coating.

In an embodiment, the quantum dot includes an InPZnSe alloy core. The quaternary alloy core or the quaternary alloy semiconductor nanocrystal particle may not include sulfur.

In the core, a mole ratio of the zinc with respect to the indium may be less than or equal to about 0.5:1, for example, less than or equal to about 0.49:1, less than or equal to about 0.48:1, less than or equal to about 0.47:1, less than or equal to about 0.46:1, or less than or equal to about 0.45:1. In the core, a mole ratio of the zinc with respect to the indium may be greater than or equal to about 0.29:1, for example, greater than or equal to about 0.3:1, greater than or equal to about 0.35:1, greater than or equal to about 0.4:1, greater than or equal to about 0.41:1, or greater than or equal to about 0.42:1.

In the core, a mole ratio of the selenium with respect to the zinc may be less than or equal to about 0.6:1, for example, less than or equal to about 0.59:1, less than or equal to about 0.58:1, less than or equal to about 0.57:1, less than or equal to about 0.56:1, less than or equal to about 0.55:1, less than or equal to about 0.54:1, less than or equal to about 0.53:1, less than or equal to about 0.52:1, less than or equal to about 0.51:1, less than or equal to about 0.50:1, or less than or equal to about 0.49:1. In the core, a mole ratio of the selenium with respect to the zinc may be greater than or equal to about 0.1:1, for example, greater than or equal to about 0.15:1, greater than or equal to about 0.2:1, greater than or equal to about 0.25:1, greater than or equal to about 0.3:1, or greater than or equal to about 0.4:1.

In the core, a mole ratio of the selenium with respect to the indium may be greater than or equal to about 0.1:1, for example, greater than or equal to about 0.15:1 and less than or equal to about 0.3:1, for example, less than or equal to about 0.25:1, or less than or equal to about 0.21:1.

In the core, a ratio of total moles of the zinc and the selenium with respect to total moles of the indium and the phosphorous (Zn+Se):(In+P) may be greater than or equal to about 0.2:1, for example, greater than or equal to about 0.25, greater than or equal to about 0.3:1, greater than or equal to about 0.31:1, greater than or equal to about 0.32:1, greater than or equal to about 0.33:1, greater than or equal to about 0.34:1, greater than or equal to about 0.35:1, or greater than or equal to about 0.36:1. The ratio of total moles of the zinc and the selenium with respect to total moles of the indium and the phosphorous may be less than or equal to about 0.65:1, for example, less than or equal to about 0.6:1, less than or equal to about 0.5:1, less than or equal to about 0.45:1, or less than or equal to about 0.4:1.

The quaternary alloy semiconductor nanocrystal may be a homogeneous alloy.

A size of the core may be greater than or equal to about 2 nm, for example, greater than or equal to about 2.1 nm, or greater than or equal to about 2.2 nm. In an embodiment, the size of the core may be less than or equal to about 3 nm, for example, less than or equal to about 2.7 nm.

The quantum dot may have a semiconductor nanocrystal shell on (e.g., directly on) the core. The semiconductor nanocrystal shell may include zinc, selenium, and sulfur.

The semiconductor nanocrystal shell may include a first layer disposed directly on the core and including a first semiconductor nanocrystal and a second layer disposed on the first layer and including a second semiconductor nanocrystal having a composition different from that of the first semiconductor nanocrystal. An energy bandgap of the second semiconductor nanocrystal may be greater than or equal to that of the first semiconductor nanocrystal.

The first semiconductor nanocrystal may include zinc, selenium, and optionally sulfur. The first semiconductor nanocrystal may include ZnSe or ZnSeS. The first semiconductor nanocrystal may not include the sulfur. A thickness of the first layer may be greater than or equal to about 3 monolayers (MLs), or greater than or equal to about 4 MLs. A thickness of the first layer may be less than or equal to about 10 MLs, less than or equal to about 9 MLs, less than or equal to about 8 MLs, or less than or equal to about 7 MLs.

The second semiconductor nanocrystal may include zinc and sulfur. The second semiconductor nanocrystal may not include selenium. The second semiconductor nanocrystal may include ZnS. The second semiconductor nanocrystal shell may be disposed directly on the first semiconductor nanocrystal shell. A thickness of the second layer may be selected appropriately. The second layer may be an outermost layer of the quantum dot. The quantum dot of an embodiment has a core-multishell structure. A thickness of the second layer may be greater than or equal to about 1 monolayer, for example, greater than or equal to about 2 MLs, greater than or equal to about 3 MLs, or greater than or equal to about 4 MLs and less than or equal to about 10 MLs, for example, less than or equal to about 9 MLs, less than or equal to about 8 MLs, less than or equal to about 7 MLs, less than or equal to about 6 MLs, or less than or equal to about 5 MLs.

In the core-shell quantum dot of an embodiment, a mole ratio of the zinc with respect to the indium may be greater than or equal to about 25:1, for example, greater than or equal to about 26:1, greater than or equal to about 27:1, greater than or equal to about 28:1, greater than or equal to about 29:1, greater than or equal to about 30:1, or greater than or equal to about 31:1 and less than or equal to about 45:1, for example, less than or equal to about 44:1, less than or equal to about 43:1, less than or equal to about 42:1, less than or equal to about 41:1, or less than or equal to about 40:1.

In the core-shell quantum dot of an embodiment, a mole ratio of the selenium with respect to the indium may be greater than or equal to about 5:1, for example, greater than or equal to about 6:1, greater than or equal to about 7:1, greater than or equal to about 8:1, greater than or equal to about 9:1, greater than or equal to about 10:1, greater than or equal to about 11:1, greater than or equal to about 12:1, greater than or equal to about 13:1, or greater than or equal to about 14:1 and less than or equal to about 20:1, for example, less than or equal to about 19:1, less than or equal to about 18:1, less than or equal to about 17:1, less than or equal to about 16:1, or less than or equal to about 15:1.

In the core-shell quantum dot of an embodiment, a mole ratio of the sulfur with respect to the indium may be greater than or equal to about 10:1, greater than or equal to about 11:1, greater than or equal to about 12:1, greater than or equal to about 13:1, or greater than or equal to about 15:1 and less than or equal to about 25:1, for example, less than or equal to about 24:1, less than or equal to about 23:1, less than or equal to about 22:1, less than or equal to about 21:1, less than or equal to about 20:1, less than or equal to about 19:1, less than or equal to about 18:1, or less than or equal to about 17:1.

In the core-shell quantum dot of an embodiment, a mole ratio of S with respect to Se may be less than or equal to about 1.5:1, for example, less than or equal to about 1.4:1, less than or equal to about 1.3:1, or less than or equal to about 1.2:1. The mole ratio of S with respect to Se may be greater than or equal to about 0.8:1, for example, greater than or equal to about 0.9:1, or greater than or equal to about 1:1.

In an embodiment, the quantum dot having the semiconductor nanocrystal shell may show a $1^{st}$ absorption peak wavelength in a range of greater than about 450 nm and a photoluminescent peak thereof, in the UV-Vis absorption spectrum.

In an embodiment, in the case of a green light emitting quantum dot, the first UV absorption peak wavelength may be greater than or equal to about 480 nm, greater than or equal to about 485 nm, greater than or equal to about 490 nm and less than or equal to about 520 nm, less than or equal to about 515 nm, or less than or equal to about 510 nm. In the case of a red light emitting quantum dot, the first UV absorption peak wavelength may be greater than or equal to about 580 nm, for example, greater than or equal to about 590 nm, and less than or equal to about 620 nm, for example, less than or equal to about 610 nm.

In an embodiment, the quantum dot having the semiconductor nanocrystal shell may emit light of a visible light wavelength region. The quantum dot of an embodiment may emit green light having a photoluminescent peak wavelength in a region of greater than or equal to about 500 nm, for example, greater than or equal to about 510 nm, or greater than or equal to about 520 nm and less than or equal to about 560 nm, for example, less than or equal to about 550 nm. The quantum dot of an embodiment may emit red light having a photoluminescent peak wavelength in a region of greater than or equal to about 600 nm, for example, greater than or equal to about 610 nm and less than or equal to about 650 nm, for example, less than or equal to about 640 nm, or less than or equal to about 630 nm.

The quantum dot may exhibit an improved level of a light emitting property. In an embodiment, the quantum yield of the quantum dot may be greater than or equal to about 70%, greater than or equal to about 75%, greater than or equal to about 80%, or greater than or equal to about 85%. In an embodiment, a full width at half maximum of a maximum luminescent peak of the quantum dot may be less than or equal to about 45 nm, for example, less than or equal to about 44 nm, less than or equal to about 43 nm, less than or equal to about 42 nm, or less than or equal to about 41 nm.

In an embodiment, the quantum dot having the semiconductor nanocrystal shell may have a size of greater than or equal to about 2 nm, greater than or equal to about 3 nm, greater than or equal to about 4 nm, or greater than or equal to about 5 nm. In an embodiment, the quantum dot may have a size of less than or equal to about 30 nm, for example, less than or equal to about 25 nm, less than or equal to about 24 nm, less than or equal to about 23 nm, less than or equal to about 22 nm, less than or equal to about 21 nm, less than or equal to about 20 nm, less than or equal to about 19 nm, less than or equal to about 18 nm, less than or equal to about 17 nm, less than or equal to about 15 nm, less than or equal to about 14 nm, less than or equal to about 13 nm, less than or equal to about 12 nm, less than or equal to about 11 nm, less than or equal to about 10 nm, less than or equal to about 9 nm, less than or equal to about 8 nm, or less than or equal to about 7 nm. The size of the quantum dot may be a diameter. When the quantum dot is a non-spherically shaped particle, the size may be a diameter of a circle of equivalent area calculated from a two dimensional area of an electron microscopic image of the particle. The size of the quantum dot may be determined by for example, a Transmission Electron Microscopic analysis, but it is not limited thereto.

A shape of the quantum dot is not particularly limited, may for example be a spherical, polyhedron, pyramid, multipod, or cube shape, nanotube, nanowire, nanofiber, nanosheet, or a combination thereof, but is not limited thereto.

The quantum dot may include the organic ligand, the organic solvent, or a combination thereof, which will be described below, on a surface of the quantum dot. The organic ligand, the organic solvent, or a combination thereof may be bound to the surface of the quantum dot.

In an embodiment, a method of producing the aforementioned quantum dot includes:

preparing a reaction liquid including an organic ligand, an indium precursor, a zinc precursor, a selenium precursor, and a phosphorous precursor in an organic solvent; and conducting a reaction in the reaction liquid at a temperature of about greater than or equal to about 290° C. for a time period of less than or equal to about 1 hour to obtain a core including a quaternary alloy semiconductor nanocrystal (hereinafter, also referred to as an alloy core).

The preparation of the reaction liquid may include mixing the indium precursor and the zinc precursor in the organic solvent in the presence of the organic ligand to obtain a mixture; and heating the mixture at a temperature of greater than or equal to about 150° C. (for example, greater than or equal to about 170° C., greater than or equal to about 180° C., or greater than or equal to about 190° C.) and less than or equal to about 220° C. (for example, less than or equal to about 210° C.) and adding the selenium precursor and the phosphorous precursor thereto.

Details of the core including the quaternary alloy semiconductor nanocrystal are the same as set forth above. The reaction liquid may not include an alkyl thiol. In an embodiment, the alloy core may be formed by a hot injection method wherein a phosphorous precursor and a selenium precursor are injected after the mixture is heated at a high temperature (at a temperature of greater than or equal to about 150° C.).

The indium precursor is not particularly limited and may be selected appropriately. In an embodiment, the indium precursor may include an indium metal powder, an alkylated indium (e.g., dimethyl indium, diethyl indium), an indium alkoxide, an indium carboxylate (e.g., indium acetate), an indium carbonate, an indium nitrate, an indium perchlorate, an indium sulfate, an indium acetylacetonate, an indium halide (e.g., indium chloride, indium bromide, indium iodide, indium fluoride), an indium cyanide, an indium hydroxide, an indium oxide, an indium peroxide, or a combination thereof.

The zinc precursor is not particularly limited and may be selected appropriately. In an embodiment, the zinc precursor may include a Zn metal powder, an alkylated Zn compound (e.g., dimethyl zinc, diethyl zinc, or a combination thereof), a Zn alkoxide, a Zn carboxylate (e.g., zinc acetate), a zinc carbonate, a Zn nitrate, a Zn perchlorate, a Zn sulfate, a Zn acetylacetonate, a Zn halide (e.g., zinc chloride, zinc bromide, zinc iodide, zinc fluoride, or a combination thereof), a Zn carbonate, a Zn cyanide, a Zn hydroxide, a Zn oxide, a Zn peroxide, or a combination thereof.

The selenium precursor is not particularly limited and may be desirably selected. In an embodiment, the selenium precursor includes selenium-trioctyl phosphine (Se-TOP), selenium-tributyl phosphine (Se-TBP), selenium-triphenyl phosphine (Se-TPP), tellurium-tributylphosphine (Te-TBP), or a combination thereof but is not limited thereto.

The phosphorous precursor is not particularly limited and may be desirably selected. In an embodiment, the phosphorous precursor may include tris(trimethylsilyl) phosphine, tris(dimethylamino) phosphine, triethylphosphine, tributylphosphine, trioctylphosphine, triphenylphosphine, tricyclohexylphosphine, or a combination thereof, but is not limited thereto.

The organic ligand may include RCOOH, $RNH_2$, $R_2NH$, $R_3N$, RSH, $RH_2PO$, $R_2HPO$, $R_3PO$, $RH_2P$, $R_2HP$, $R_3P$, ROH, RCOOR', $RPO(OH)_2$, RHPOOH, $R_2POOH$ (wherein R and R' are the same or different, and are independently a hydrogen, a C1 to C40 (or C3 to C24) aliphatic hydrocarbon group (e.g., a alkyl group, a alkenyl group, or a alkynyl group), a C6 to C40 aromatic hydrocarbon group (such as a C6 to C20 aryl group), a polymeric organic ligand, or a combination thereof.

The organic ligand may coordinate to, e.g., be bound to, the surface of the obtained nanocrystal and help the nanocrystal to be well dispersed in the solution, and/or may affect light emitting and electrical characteristics of quantum dots, or a combination thereof.

Examples of the organic ligand may include methane thiol, ethane thiol, propane thiol, butane thiol, pentane thiol, hexane thiol, octane thiol, dodecane thiol, hexadecane thiol, octadecane thiol, or benzyl thiol; methane amine, ethane amine, propane amine, butyl amine, pentyl amine, hexyl amine, octyl amine, dodecyl amine, hexadecyl amine, octadecyl amine, dimethyl amine, diethyl amine, dipropyl amine; methanoic acid, ethanoic acid, propanoic acid, butanoic acid, pentanoic acid, hexanoic acid, heptanoic acid, octanoic acid, dodecanoic acid, hexadecanoic acid, octadecanoic acid, oleic acid, or benzoic acid; phosphine such as substituted or unsubstituted methyl phosphine (e.g., trimethyl phosphine, methyldiphenyl phosphine, etc.), substituted or unsubstituted ethyl phosphine (e.g., triethyl phosphine, ethyldiphenyl phosphine, etc.), substituted or unsubstituted propyl phosphine, substituted or unsubstituted butyl phosphine, substituted or unsubstituted pentyl phosphine, or substituted or unsubstituted octylphosphine (e.g., trioctylphosphine (TOP)); phosphine oxide such as substituted or unsubstituted methyl phosphine oxide (e.g., trimethyl phosphine oxide, methyldiphenyl phosphine oxide, etc.), substituted or unsubstituted ethyl phosphine oxide (e.g., triethyl phosphine oxide, ethyldiphenyl phosphine oxide, etc.), substituted or unsubstituted propyl phosphine oxide, substituted or unsubstituted butyl phosphine oxide, or substituted or unsubstituted octyl phosphine oxide (e.g., trioctylphosphine oxide (TOPO); diphenyl phosphine, triphenyl phosphine compound, or an oxide compound thereof; an alkylphosphinic acid, an alkylphosphonic acid; or the like, but are not limited thereto. The organic ligand may be used alone or as a mixture of at least two ligand compounds.

The solvent may a C6 to C22 primary amine such as hexadecylamine; a C6 to C22 secondary amine such as dioctylamine; a C6 to C40 tertiary amine such as trioctylamine; a nitrogen-containing heterocyclic compound such as pyridine; a C6 to C40 aliphatic hydrocarbon (e.g., alkane, alkene, alkyne, etc.) such as hexadecane, octadecane, octadecene, or squalane; a C6 to C30 aromatic hydrocarbon such as phenyldodecane, phenyltetradecane, or phenyl hexadecane; a phosphine substituted with a C6 to C22 alkyl group such as trioctylphosphine, a phosphine oxide substituted with a C6 to C22 alkyl group such as trioctylphosphine oxide; a C12 to C22 aromatic ether such as phenyl ether, or benzyl ether, or a combination thereof. Types and amounts of the solvent may be appropriately selected considering precursors and organic ligands.

In the reaction system, an amount of each of the precursors, a reaction temperature, and a reaction time are controlled such that the core has the aforementioned composition and the aforementioned size.

The method may further include forming a semiconductor nanocrystal shell on the alloy core. Details of the semiconductor nanocrystal shell are the same as set forth above.

The forming of the semiconductor nanocrystal shell may include:

obtaining a mixture including a first shell precursor containing a metal (e.g., zinc), an organic ligand, and an organic solvent;

optionally heating the mixture; and injecting the core and a second precursor containing a chalcogen (e.g., selenium, sulfur, or a combination thereof) to the (optionally heated) mixture and keeping the mixture at a reaction temperature for a predetermined time (e.g., for about 40 minutes or longer) to form a semiconductor nanocrystal shell on the core.

The first shell precursor may include a zinc precursor. The second shell precursor may include a selenium precursor, a sulfur precursor, or a combination thereof. Details of the organic ligand, the organic solvent, the zinc precursor, and the selenium precursor are the same as set forth above.

The sulfur precursor is not particularly limited and may be selected appropriately. The sulfur precursor may include hexane thiol, octane thiol, decane thiol, dodecane thiol, hexadecane thiol, mercapto propyl silane, sulfur-trioctylphosphine (S-TOP), sulfur-tributylphosphine (S-TBP), sulfur-triphenylphosphine (S-TPP), sulfur-trioctylamine (S-TOA), trimethylsilyl sulfide, sulfide ammonium, sodium sulfide, or a combination thereof.

The forming of the semiconductor nanocrystal shell may include:

Injecting the second shell precursor and optionally the first shell precursor at least two times into a reaction system and keeping a temperature thereof at the reaction temperature for a predetermined period of time to form a first layer disposed (directly) on the alloy core and including a first semiconductor nanocrystal (e.g., ZnSe), and then forming a second layer including a second semiconductor nanocrystal (e.g., ZnS, ZnSeS, or a combination thereof) on the first layer.

The time period for the formation of the semiconductor nanocrystal shell (or each layer thereof) may be selected appropriately in light of a desired composition. In an embodiment, each of the time periods for forming the semiconductor nanocrystal shell (or the first layer thereof, the second layer thereof, or a combination thereof) may be greater than or equal to about 40 minutes, for example, greater than or equal to about 50 minutes, greater than or equal to about 60 minutes, greater than or equal to about 70 minutes, greater than or equal to about 80 minutes, or greater than or equal to about 90 minutes and less than or equal to about 4 hours, for example, less than or equal to about 3 hours, or less than or equal to about 2 hours. The reaction temperature for forming the shell may be selected appropriately. In an embodiment, the reaction temperature may be greater than or equal to about 280° C., greater than or equal to about 290° C., greater than or equal to about 300° C., greater than or equal to about 310° C., or greater than or equal to about 315° C. and less than or equal to about 350° C., less than or equal to about 340° C., or less than or equal to about 335° C.

In an embodiment wherein the quantum dot includes a first layer including ZnSe or ZnSeS on the aforementioned alloy core, and a second layer including ZnS, the semiconductor nanocrystal shell may be formed by obtaining a mixture including a zinc precursor, an organic ligand, and an organic solvent, optionally heating the mixture, and injecting into the optionally heated mixture the alloy core, a predetermined amount of a selenium precursor, (and optionally a predetermined amount of a sulfur precursor) and keeping a resulting mixture at a reaction temperature for a predetermined time (e.g., of at least 40 minutes) to form the first layer on the alloy core, then injecting a zinc precursor and a sulfur precursor (and optionally a selenium precursor) thereto and keep the same at a reaction temperature for another predetermined time (e.g., at least 40 minutes) to form a second layer on the first layer. In an embodiment, a reaction system for the formation of the second layer may not include a selenium precursor.

In an embodiment, in a reaction system for forming the first layer or the second layer, a concentration of the sulfur precursor or the selenium precursor may be changed (decreased) during the reaction time so that in the first layer or the second layer, a concentration of the sulfur or the selenium may change in a radial direction of the quantum dot.

The method may not include cooling the reaction solution including a particle having the first semiconductor nanocrystal shell down to a temperature below 100° C. (for example, of less than or equal to about 50° C., of less than or equal to about 30° C. or down to room temperature).

When the non-solvent is added into the obtained final reaction solution, the organic ligand-coordinated nanocrystal may be separated (e.g., precipitated). The non-solvent may be a polar solvent that is miscible with the solvent used in the reaction and nanocrystals are not dispersible therein. The non-solvent may be selected depending on the solvent used in the reaction and may be for example, acetone, ethanol, butanol, isopropanol, ethanediol, water, tetrahydrofuran (THF), dimethyl sulfoxide (DMSO), diethyl ether, formaldehyde, acetaldehyde, a solvent having a similar solubility parameter to the foregoing solvents, or a combination thereof. The separation may be performed through a centrifugation, precipitation, chromatography, or distillation. The separated nanocrystal may be added to a washing solvent and washed, if desired. The washing solvent is not particularly limited and may include a solvent having a similar solubility parameter to that of the ligand and may, for example, include hexane, heptane, octane, chloroform, toluene, benzene, or the like.

The quantum dots may be dispersed in a dispersing solvent. The quantum dots may form an organic solvent dispersion. The organic solvent dispersion may be free of water, may be free of a water miscible organic solvent, or a combination thereof. The dispersing solvent may be selected appropriately. The dispersing solvent may include (or consists of) the aforementioned organic solvent. The dispersing solvent may include (or consists of) a substituted or unsubstituted C1 to C40 aliphatic hydrocarbon, a substituted or unsubstituted C6 to C40 aromatic hydrocarbon, or a combination thereof.

In an embodiment, a quantum dot composition includes: the aforementioned (cadmium free) quantum dots; a dispersing agent for dispersing the quantum dot (e.g., a binder polymer including a carboxylic acid group); a polymerizable (e.g., photopolymerizable) monomer including a carbon-carbon double bond; and optionally an initiator (e.g., a photoinitiator or a thermal initiator). The composition may further include an organic solvent, and/or a liquid vehicle, or a combination thereof. The composition may be photosensitive.

The composition of an embodiment may be used for a pattern of a quantum dot polymer composite. In an embodiment, the composition may be a photoresist composition that may be applicable to a photolithography process. In other embodiments, the composition may be an ink composition that may be applicable to an ink jet process (e.g., a liquid drop discharging method such as an ink jet printing). In an embodiment, the composition may not include a conjugated polymer (except for a cardo binder that will be described below). In an embodiment, the composition may include a conjugated polymer. As used herein, the conjugated polymer may be a polymer having a conjugated double bond such as a polyphenylene vinylene.

In the composition, details for the (cadmium free) quantum dots are the same as set forth above. In the composition, the amount of the quantum dot may be selected appropriately in light of the types and amounts of other components in the composition and a final use thereof. In an embodiment, the amount of the quantum dot may be greater than or equal to about 1 weight percent (wt %), for example, greater than or equal to about 2 wt %, greater than or equal to about 3 wt %, greater than or equal to about 4 wt %, greater than or equal to about 5 wt %, greater than or equal to about 6 wt %, greater than or equal to about 7 wt %, greater than or equal to about 8 wt %, greater than or equal to about 9 wt %, greater than or equal to about 10 wt %, greater than or equal to about 15 wt %, greater than or equal to about 20 wt %, greater than or equal to about 25 wt %, greater than or equal to about 30 wt %, greater than or equal to about 35 wt %, or greater than or equal to about 40 wt %, based on a total solid content of the composition. The amount of the quantum dot may be less than or equal to about 70 wt %, for example, less than or equal to about 65 wt %, less than or equal to about 60 wt %, less than or equal to about 55 wt %, or less than or equal to about 50 wt %, based on a total solid content of the composition. A weight percent of a component based on a total solid content of the composition may represent the amount of the component in the composite, which will be described below.

In the composition of an embodiment, a dispersing agent is a compound capable of dispersing the quantum dots. The dispersing agent may be a binder polymer including a carboxylic acid group (for example, in repeating units of the binder polymer). The binder polymer may be an (electrically) insulative polymer.

In an embodiment, the binder polymer may include:

a copolymer of a monomer combination including a first monomer, a second monomer, and optionally a third monomer, the first monomer including a carboxylic acid group and a carbon-carbon double bond, the second monomer including a carbon-carbon double bond and a hydrophobic moiety and not including a carboxylic acid group, and the third monomer including a carbon-carbon double bond and a hydrophilic moiety and not including a carboxylic acid group;

a multi-aromatic ring-containing polymer including a carboxylic acid group (—COOH) and having a backbone structure in a main chain (e.g., a backbone structure incorporated in the main chain), wherein the backbone structure includes a cyclic group including a quaternary carbon atom and two aromatic rings bound to the quaternary carbon atom (e.g., also known as a cardo binder);

or a combination thereof.

Examples of the first monomer may include, but are not limited to, acrylic acid, methacrylic acid, maleic acid, itaconic acid, fumaric acid, 3-butenoic acid, and other carboxylic acid vinyl ester compounds. The first monomer may include one or more compounds.

Examples of the second monomer may include, but are not limited to:

alkenyl aromatic compounds such as styrene, α-methyl styrene, vinyl toluene, or vinyl benzyl methyl ether;

unsaturated carboxylic acid ester compounds such as methyl acrylate, methyl methacrylate, ethyl acrylate, ethyl methacrylate, butyl acrylate, butyl methacrylate, benzyl acrylate, benzyl methacrylate, cyclohexyl acrylate, cyclohexyl methacrylate, phenyl acrylate, or phenyl methacrylate;

unsaturated carboxylic acid amino alkyl ester compounds such as 2-amino ethyl acrylate, 2-amino ethyl methacrylate, 2-dimethyl amino ethyl acrylate, or 2-dimethyl amino ethyl methacrylate;

maleimides such as N-phenylmaleimide, N-benzylmaleimide, or N-alkylmaleimide;

unsaturated carboxylic acid glycidyl ester compounds such as glycidyl acrylate or glycidyl methacrylate;

vinyl cyanide compounds such as acrylonitrile or methacrylonitrile; and unsaturated amide compounds such as acrylamide or methacrylamide, but are not limited thereto.

As the second monomer, one or more compounds may be used.

If present, examples of the third monomer may include 2-hydroxy ethyl acrylate, 2-hydroxy ethyl methacrylate, hydroxy propyl acrylate, hydroxy propyl methacrylate, 2-hydroxy butyl acrylate, and 2-hydroxy butyl methacrylate, but are not limited thereto. The third monomer may include one or more compounds.

In an embodiment, in the binder polymer, an amount of a first repeating unit derived from the first monomer may be greater than or equal to about 5 mole percent (mol %), for example, greater than or equal to about 10 mol %, greater than or equal to about 15 mol %, greater than or equal to about 25 mol %, or greater than or equal to about 35 mol %. In the binder polymer, an amount of the first repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

In the binder polymer, an amount of a second repeating unit derived from the second monomer may be greater than or equal to about 5 mol %, for example, greater than or equal to about 10 mol %, greater than or equal to about 15 mol %, greater than or equal to about 25 mol %, or greater than or equal to about 35 mol %. In the binder polymer, an amount of the second repeating unit may be less than or equal to about 95 mol %, for example, less than or equal to about 90 mol %, less than or equal to about 89 mol %, less than or equal to about 88 mol %, less than or equal to about 87 mol %, less than or equal to about 86 mol %, less than or equal to about 85 mol %, less than or equal to about 80 mol %, less than or equal to about 70 mol %, less than or equal to about 60 mol %, less than or equal to about 50 mol %, less than or equal to about 40 mol %, less than or equal to about 35 mol %, or less than or equal to about 25 mol %.

If present, in the binder polymer, an amount of a third repeating unit derived from the third monomer, when present, may be greater than or equal to about 1 mol %, for example, greater than or equal to about 5 mol %, greater than or equal to about 10 mol %, or greater than or equal to about 15 mol %. In the binder polymer, an amount of the third repeating unit, when present, may be less than or equal to about 30 mol %, for example, less than or equal to about 25 mol %, less than or equal to about 20 mol %, less than or equal to about 18 mol %, less than or equal to about 15 mol %, or less than or equal to about 10 mol %.

In an embodiment, the binder polymer may include a copolymer of (meth)acrylic acid and at least one second or third monomer including a (C6-C9 aryl) or (C1-C10 alkyl) (meth)acrylate, hydroxyl(C1-C10 alkyl) (meth)acrylate, or styrene. For example, the binder polymer may include a (meth)acrylic acid/methyl (meth)acrylate copolymer, a (meth)acrylic acid/benzyl (meth)acrylate copolymer, a (meth)acrylic acid/benzyl (meth)acrylate/styrene copolymer, a (meth)acrylic acid/benzyl (meth)acrylate/2-hydroxy ethyl (meth)acrylate copolymer, a (meth)acrylic acid/benzyl (meth)acrylate/styrene/2-hydroxy ethyl (meth)acrylate copolymer, or a combination thereof.

In an embodiment, the binder polymer may include a multi-aromatic ring-containing polymer. The multi-aromatic ring-containing polymer is also known as a cardo binder, which may be commercially available.

The carboxylic acid group-containing binder may have an acid value of greater than or equal to about 50 mg KOH/g. For example, the carboxylic acid group-containing binder may have an acid value of greater than or equal to about 60 mg KOH/g, greater than or equal to about 70 mg KOH/g, greater than or equal to about 80 mg KOH/g, greater than or equal to about 90 mg KOH/g, greater than or equal to about 100 mg KOH/g, greater than or equal to about 110 mg KOH/g, greater than or equal to about 120 mg KOH/g, greater than or equal to about 125 mg KOH/g, or greater than or equal to about 130 mg KOH/g, but is not limited thereto. The carboxylic acid group-containing binder may have an acid value of less than or equal to about 250 mg KOH/g, for example, less than or equal to about 240 mg KOH/g, less than or equal to about 230 mg KOH/g, less than or equal to about 220 mg KOH/g, less than or equal to about 210 mg KOH/g, less than or equal to about 200 mg KOH/g, less than or equal to about 190 mg KOH/g, less than or equal to about 180 mg KOH/g, or less than or equal to about 160 mg KOH/g, but is not limited thereto.

The binder polymer (e.g., containing the carboxylic acid group, such as the carboxylic acid group-containing binder) may have a molecular weight of greater than or equal to about 1,000 grams per mole (g/mol), for example, greater than or equal to about 2,000 g/mol, greater than or equal to about 3,000 g/mol, or greater than or equal to about 5,000 g/mol. The binder polymer may have a molecular weight of less than or equal to about 100,000 g/mol, for example, less than or equal to about 50,000 g/mol or less than or equal to about 25,000 g/mol.

In the composition, an amount of the dispersing agent (e.g., the binder polymer) may be greater than or equal to about 0.5 wt %, for example, greater than or equal to about 1 wt %, greater than or equal to about 5 wt %, greater than or equal to about 10 wt %, greater than or equal to about 15 wt %, or greater than or equal to about 20 wt %, based on a total weight (or a total solid content) of the composition. In an embodiment, an amount of the carboxylic acid group-containing binder may less than or equal to about 50 wt %, less than or equal to about 40 wt %, less than or equal to about 35 wt %, less than or equal to about 33 wt %, or less than or equal to about 30 wt %, based on a total weight (or a total solid content) of the composition. The amount of the binder polymer may be greater than or equal to about 0.5 wt % and less than or equal to about 55%.

In the composition according to an embodiment, the (photo)polymerizable monomer including at least one (e.g., at least two, at least three, or more) carbon-carbon double bond may include a (meth)acrylate monomer. Examples of the photopolymerizable monomer may include, but are not limited to, a C1-C10-alkyl (meth)acrylate, ethylene glycol di(meth)acrylate, triethylene glycol di(meth)acrylate, diethylene glycol di(meth)acrylate, 1,4-butanediol di(meth)acrylate, 1,6-hexanediol di(meth)acrylate, neopentyl glycol di(meth)acrylate, pentaerythritol di(meth)acrylate, pentaerythritol tri(meth)acrylate, pentaerythritol tetra(meth)acrylate, dipentaerythritol di(meth)acrylate, dipentaerythritol tri(meth)acrylate, dipentaerythritol penta(meth)acrylate, dipentaerythritol hexa(meth)acrylate, bisphenol A epoxy (meth)acrylate, bisphenol A di(meth)acrylate, trimethylolpropane tri(meth)acrylate, ethylene glycol monomethyl ether (meth)acrylate, novolac epoxy (meth)acrylate, propylene glycol di(meth)acrylate, tris(meth)acryloyloxyethyl phosphate, or a combination thereof.

The amount of the (photo)polymerizable monomer may be greater than or equal to about 0.5 wt %, for example, greater than or equal to about 1 wt %, or greater than or equal to about 2 wt % with respect to a total weight (or a total solid content) of the composition. The amount of the photopolymerizable monomer may be less than or equal to about 50 wt %, for example, less than or equal to about 40 wt %, less than or equal to about 30 wt %, less than or equal to about 28 wt %, less than or equal to about 25 wt %, less than or equal to about 23 wt %, less than or equal to about 20 wt %, less than or equal to about 18 wt %, less than or equal to about 17 wt %, less than or equal to about 16 wt %, or less than or equal to about 15 wt % with respect to a total weight (or a total solid content) of the composition.

The (photo) initiator included in the composition may be for the polymerization of the (photo)polymerizable monomer. The initiator may be a compound that can generate a radical species under a mild condition (e.g., by light or heat) to promote the initiation of a radical reaction (e.g., a radical polymerization of a monomer). The initiator may be a thermal initiator or a photoinitiator.

Examples of the thermal initiator may include azobisisobutyronitrile (AIBN), benzoyl peroxide (BPO) or the like but are not limited thereto.

The initiator is not particularly limited and may be selected appropriately.

The photoinitiator may be a compound that can initiate a radical polymerization of the aforementioned photopolymerizable (e.g., acryl based) monomer, a thiol compound that will be described below, or a combination thereof. The photoinitiator is not particularly limited. The photoinitiator may include a triazine compound, an acetophenone compound, a benzophenone compound, a thioxanthone compound, a benzoin compound, an oxime compound, an aminoketone compound, a phosphine or phosphine oxide compound, a carbazole compound, a diketone compound, a sulfonium borate compound, a diazo compound, a diimidazole compound, a carbazole compound, a diketone compound, a sulfonium borate compound, an azo compound (e.g., diazo compound), a biimidazole compound, or a combination thereof.

In the composition of an embodiment, an amount of the initiator may be adjusted in light of the types and the amount of the photopolymerizable monomer as used. In an embodiment, the amount of the initiator may be greater than or equal to about 0.01 wt % or greater than or equal to about 1 wt % and less than or equal to about 10 wt %, less than or equal to about 9 wt %, less than or equal to about 8 wt %, less than or equal to about 7 wt %, less than or equal to about 6 wt %, or less than or equal to about 5 wt % based on a total weight (or a total solid content) of the composition, but is not limited thereto.

The (photosensitive) composition may further include a thiol compound (e.g., a monothiol compound or a multi-thiol compound having two or greater thiol groups), a metal oxide fine particle, or a combination thereof.

When a plurality of metal oxide fine particles is present in the polymer matrix, the metal oxide fine particles may include $TiO_2$, $SiO_2$, $BaTiO_3$, $Ba_2TiO_4$, ZnO, or a combination thereof. An amount of the metal oxide fine particle may be less than or equal to about 50 wt %, less than or equal to about 40 wt %, less than or equal to about 30 wt %, less than or equal to about 25 wt %, less than or equal to about 20 wt %, less than or equal to about 15 wt % and greater than or equal to about 1 wt %, or greater than or equal to about 5 wt % based on a total weight (or a total solid content) of the composition.

A particle size of the metal oxide fine particles is not particularly limited and may be selected appropriately. The particle size of the metal oxide fine particles may be greater than or equal to about 100 nm, greater than or equal to about 150 nm, or greater than or equal to about 200 nm and less than or equal to about 1,000 nm, less than or equal to about 900 nm, or less than or equal to about 800 nm.

The multi-thiol compound may include a dithiol compound, a trithiol compound, a tetrathiol compound, or a combination thereof. For example, the multi-thiol compound may include glycol di-3-mercaptopropionate (e.g., ethylene glycol di-3-mercaptopropionate), glycol dimercaptoacetate (e.g., ethylene glycol dimercaptoacetate), trimethylolpropane tris(3-mercaptopropionate), pentaerythritol tetrakis(3-mercaptopropionate), pentaerythritol tetrakis(2-mercaptoacetate), 1,6-hexanedithio, 1,3-propanedithiol, 1,2-ethanedithiol, polyethylene glycol dithiol including 1 to 10 ethylene glycol repeating units, or a combination thereof.

Based on a total weight (or a total solid content) of the composition, an amount of the thiol compound may be less than or equal to about 50 wt %, less than or equal to about 40 wt %, less than or equal to about 30 wt %, less than or equal to about 20 wt %, less than or equal to about 10 wt %, less than or equal to about 9 wt %, less than or equal to about 8 wt %, less than or equal to about 7 wt %, less than or equal to about 6 wt %, or less than or equal to about 5 wt %. The amount of the thiol compound may be greater than or equal to about 0.1 wt %, for example, greater than or equal to about 0.5 wt %, greater than or equal to about 1 wt %, greater than or equal to about 5 wt %, greater than or equal to about 10 wt %, or greater than or equal to about 15 wt %, based on a total weight (or a total solid content) of the composition.

The composition may further include an organic solvent, a liquid vehicle, or a combination thereof (hereinafter, simply referred to as "organic solvent"). The organic solvent, the liquid vehicle, or a combination thereof are not particularly limited. Types and amounts of the organic solvent may be appropriately selected by considering the aforementioned main components (i.e., the quantum dot, the COOH group-containing binder, the photopolymerizable monomer, the photoinitiator, and if used, the thiol compound), and types and amounts of additives which will be described below. The composition may include a solvent in a residual amount except for a desired amount of the solid content (non-volatile components). The solvent may be appropriately selected by considering the other components (e.g., a binder, a photopolymerizable monomer, a photoinitiator, and other additives) in the composition, affinity for an alkali-developing solution, a boiling point, or the like. Non-limiting examples of the solvent and the liquid vehicle may include, but are not limited to: ethyl 3-ethoxy propionate; an ethylene glycol series such as ethylene glycol, diethylene glycol, or polyethylene glycol; a glycol ether such as ethylene glycol monomethyl ether, ethylene glycol monoethyl ether, diethylene glycol monomethyl ether, ethylene glycol diethyl ether, or diethylene glycol dimethyl ether; glycol ether acetates such as ethylene glycol monomethyl ether acetate, ethylene glycol monoethyl ether acetate, diethylene glycol monoethyl ether acetate, or diethylene glycol monobutyl ether acetate; a propylene glycol series such as propylene glycol; a propylene glycol ether such as propylene glycol monomethyl ether, propylene glycol monoethyl ether, propylene glycol monopropyl ether, propylene glycol monobutyl ether, propylene glycol dimethyl ether, dipropylene glycol dimethyl ether, propylene glycol diethyl ether, or dipropylene glycol diethyl ether; a propylene glycol ether acetate such as propylene glycol monomethyl ether acetate or dipropylene glycol monoethyl ether acetate; an amide such as N-methylpyrrolidone, dimethyl formamide, or dimethyl acetamide; a ketone such as methyl ethyl ketone (MEK), methyl isobutyl ketone (MIBK), or cyclohexanone; a petroleum product such as toluene, xylene, or solvent naphtha; an ester such as ethyl acetate, propyl acetate, butyl acetate, cyclohexyl acetate, or ethyl lactate; an ether such as diethyl ether, dipropyl ether, or dibutyl ether; chloroform, a C1 to C40 aliphatic hydrocarbon (e.g., alkane, alkene, or alkyne), a halogen (e.g., chloro) substituted C1 to C40 aliphatic hydrocarbon (e.g., dichloroethane, trichloromethane, or the like), a C6 to C40 aromatic hydrocarbon (e.g., toluene, xylene, or the like), a halogen (e.g., chloro) substituted C6 to C40 aromatic hydrocarbon, or a combination thereof.

The composition may further include various additives such as a light diffusing agent, a leveling agent, or a coupling agent, in addition to the aforementioned components. The amount of the additive is not particularly limited, and may be selected within an appropriate range, wherein the additive does not cause an adverse effect on the preparation of the composition, the preparation of the quantum dot polymer composite, and optionally, the patterning of the composite. Types and examples of the aforementioned additives may include any suitable compound having a desired function and are not particularly limited.

If present, the amount of the additives may be, based on a total weight of the composition (or a solid content of the composition), greater than or equal to about 0.1 wt %, for example, greater than or equal to about 0.5 wt %, greater than or equal to about 1 wt %, greater than or equal to about 2 wt %, or greater than or equal to about 5 wt %, but it is not limited thereto. If present, the amount of the additives may be less than or equal to about 20 wt %, for example, less than or equal to about 19 wt %, less than or equal to about 18 wt %, less than or equal to about 17 wt %, less than or equal to about 16 wt %, or less than or equal to about 15 wt %, but it is not limited thereto.

The composition may be prepared by mixing the aforementioned components appropriately. The composition may provide a quantum dot polymer composite or a quantum dot pattern via polymerization (e.g., photopolymerization).

In an embodiment, a quantum dot polymer composite may include a polymer matrix; and the aforementioned quantum dots dispersed in the polymer matrix.

The polymer matrix may include a thiolene resin, a linear or crosslinked substituted or unsubstituted poly(meth)acrylate, a linear or crosslinked substituted or unsubstituted polyurethane, a linear or crosslinked substituted or unsubstituted epoxy resin, a linear or crosslinked substituted or unsubstituted vinyl polymer, a linear or crosslinked substituted or unsubstituted silicone resin, or a combination thereof.

In an embodiment, the polymer matrix may include a crosslinked polymer, a dispersing agent (for example, a binder polymer including a carboxylic acid group), or a combination thereof. The crosslinked polymer may include a thiolene polymer, a crosslinked (meth)acrylate polymer, a crosslinked polyurethane, a crosslinked epoxy resin, a crosslinked vinyl polymer, a crosslinked silicone resin, or a combination thereof.

The polymer matrix may include a binder polymer; a polymerization product of a photopolymerizable monomer including at least one (e.g., at least two, three, four, or five or more) carbon-carbon double bond(s); optionally a polymerization product of the photopolymerizable monomer and a multi-thiol compound including at least two thiol groups at its terminal ends; or a combination thereof. The polymer matrix may not include a conjugated polymer other than the cardo binder.

Details of the (cadmium free) quantum dot, the dispersing agent such as the binder polymer, the photopolymerizable monomer, or the multi-thiol compound are the same as set forth above.

The quantum dot polymer composite may be in a form of a film or a sheet.

The film of the quantum dot polymer composite or a pattern thereof may have, for example, a thickness of less than or equal to about 30 µm, for example, less than or equal to about 10 µm, less than or equal to about 8 µm, or less than or equal to about 7 µm and greater than about 2 µm, for example, greater than or equal to about 3 µm, greater than or equal to about 3.5 µm, or greater than or equal to about 4 µm.

The quantum dot polymer composite may exhibit improved thermal stability. Accordingly, the quantum dot polymer composite may exhibit photo-conversion efficiency (PCE) of greater than or equal to about 20% when being heat-treated at about 180° C. for about 30 minutes under a nitrogen atmosphere.

In an embodiment, a display device includes a light source and a light emitting element (e.g., a photoluminescent element), and the light emitting element includes the above quantum dot-polymer composite, and the light source is configured to provide the light emitting element with incident light. The incident light may have a luminescence peak wavelength of greater than or equal to about 440 nm, for example, greater than or equal to about 450 nm and less than or equal to about 460 nm.

In an embodiment, the light emitting element may include a sheet of the quantum dot polymer composite. The display device may further include a liquid crystal panel and the sheet of the quantum dot polymer composite may be disposed between the light source and the liquid crystal panel. FIG. 1A shows an exploded view of a non-limiting display device.

Referring to FIG. 1A, the display device may have a structure wherein a reflector, a light guide panel (LGP) and a blue LED light source (Blue-LED), the quantum dot-polymer composite sheet (QD sheet), for example, various optical films such as a prism, double brightness enhance film (DBEF), or the like are stacked and a liquid crystal (LC) panel is disposed thereon.

Figure 1B:
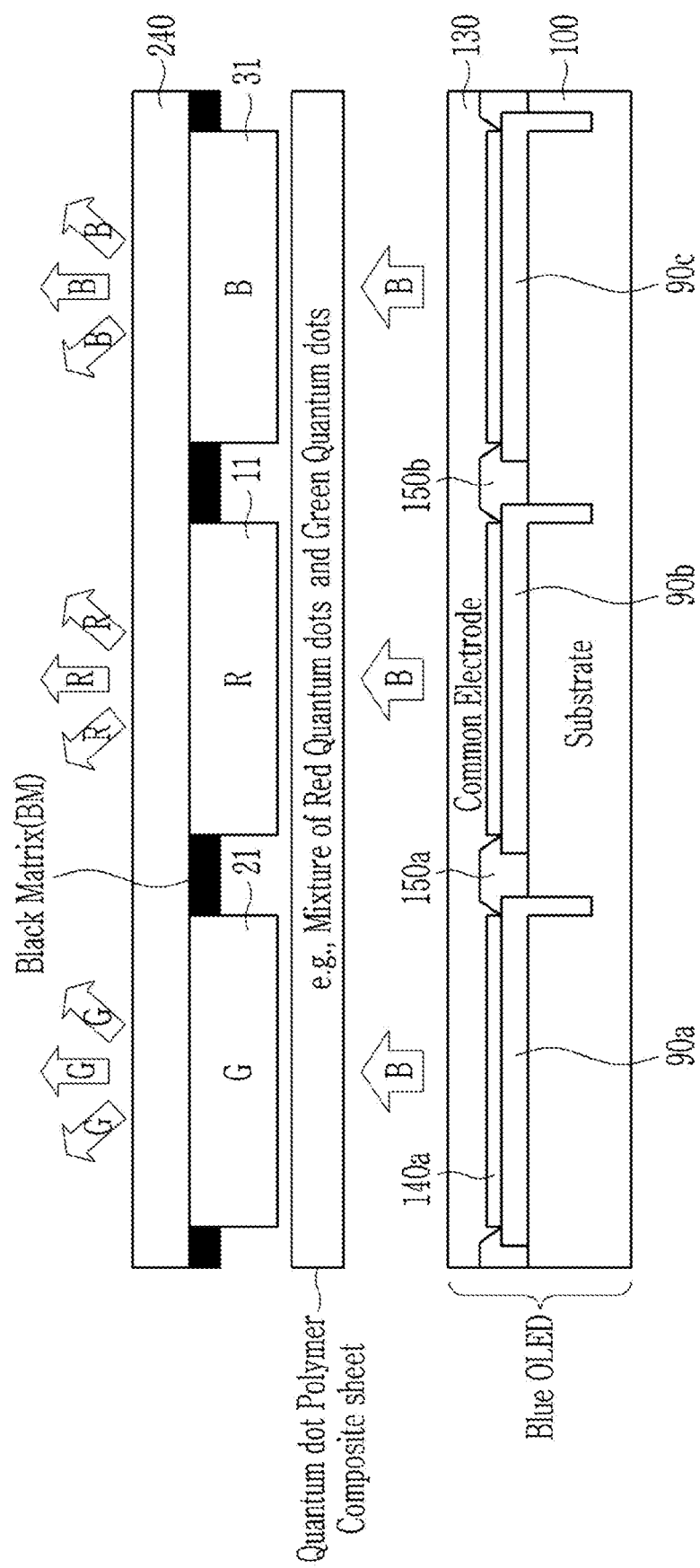
FIG. 1B is a cross-sectional view of a device according to an embodiment.

In an embodiment, the display device may not include a liquid crystal layer. The display device may include a blue organic light emitting diode as a light source. Referring to FIG. 1B, the display device includes a (blue) OLED as a light source, over which a quantum dot polymer composite sheet including a mixture of red light emitting quantum dots (QDs) and green light emitting QDs. Over the quantum dot polymer composite sheet, an absorption color filter layer having red/green/blue sections and optionally a substrate may be disposed.

An organic light emitting diode may have at least two pixel electrodes formed on a substrate, a pixel define layer between adjacent pixel electrodes, and an organic emission layer formed on each of the pixel electrodes, a common electrode layer disposed over the organic emission layer.

The substrate may include an insulative material and may have flexibility. Details of the substrate will be described below.

A line layer including a thin film transistor or the like is formed on the substrate. The line layer may further include a gate line, a sustain voltage line, a gate insulating layer, a data line, a source electrode, a drain electrode, a semiconductor, a protective layer, or the like. The detail structure of the line layer may be verified according to an embodiment. The gate line and the sustain voltage line are electrically separated from each other, and the data line is insulated and crossing the gate line and the sustain voltage line. The gate electrode, the source electrode, and the drain electrode form a control terminal, an input terminal, and an output terminal of the thin film transistor, respectively. The drain electrode is electrically connected to the pixel electrode.

The pixel electrode may function as an anode of the display device. The pixel electrode may be formed of a transparent conductive material such as indium tin oxide (ITO) or indium zinc oxide (IZO). The pixel electrode 112 may be formed of a material having a light-blocking properties such as gold (Au), platinum (Pt), nickel (Ni), tungsten (W), chromium (Cr), molybdenum (Mo), iron (Fe), cobalt Co), copper (Cu), palladium Pd), titanium (Ti), or the like. Alternatively, the pixel electrode 112 may have a two-layered structure in which the transparent conductive material and the material having light-blocking properties are stacked sequentially.

Between two adjacent pixel electrodes, a pixel define layer (PDL) overlapped with a terminal end of the pixel electrode to divide the pixel electrode into a pixel unit. The pixel define layer is an insulation layer which may electrically block the at least two pixel electrodes.

The pixel define layer covers a portion of the upper surface of the pixel electrode, and the remaining region of the pixel electrode that is not covered by the pixel define layer may provide an opening. An organic emission layer, which will be described below, may be formed on the region defined by the opening.

The organic emission layer defines each pixel area by the pixel electrode and the pixel define layer. In other words, one pixel area may be defined as an area that is formed with one organic emission unit layer which is contacted with one pixel electrode divided by the pixel define layer.

For example, in the display device according to an embodiment, the organic emission layer may be defined as a first pixel area, a second pixel area, and a third pixel area, and each pixel area is spaced apart from each other leaving a predetermined interval by the pixel define layer.

In an embodiment, the organic emission layer may emit a third light belong to visible light region or belong to UV region. Each of the first to the third pixel areas of the organic emission layer may emit third light. In an embodiment, the third light may be a light having the highest energy in the visible light region, for example, may be blue light.

When all pixel areas of the organic emission layer are designed to emit the same light, each pixel area of the organic emission layer may be all formed of the same or similar materials or may show the same or similar properties. Thus it may significantly relieve a process difficulty of forming the organic emission layer, so the display device may be easily applied for the large scale/large area process. However, the organic emission layer according to an embodiment is not necessarily limited thereto, but the organic emission layer may be designed to emit at least two different lights.

The organic emission layer includes an organic emission unit layer in each pixel area, and each organic emission unit layer may further include an auxiliary layer (e.g., hole injection layer (HIL), hole transport layer (HTL), electron transport layer (ETL), etc.) besides the emission layer.

The common electrode may function as a cathode of the display device 10. The common electrode 114 may be formed of a transparent conductive material such as indium tin oxide (ITO) or indium zinc oxide (IZO). The common electrode may be formed on the organic emission layer and may be integrated therewith.

A planarization layer or a passivation layer may be formed on the common electrode. The planarization layer may include an insulating material for providing electrical insulation with the common electrode.

An absorptive color filter layer may be formed corresponding to each of the pixel areas. The absorptive color filter layer may include a green section that may selectively transmit green light with absorbing and blocking lights other than green light, a red section that may selectively transmit red light with absorbing and blocking lights other than red light, and a blue section that may selectively transmit blue light with absorbing and blocking green and red lights (e.g., lights having a wavelength of less than or equal to about 500 nm).

In other embodiments, the display device may include a stacked structure including a (e.g., transparent) substrate and a light emitting layer (e.g., a photoluminescent layer) disposed on the substrate as a light emitting element.

In the stacked structure, the light emitting layer includes a pattern of the quantum dot polymer composite, and the pattern may include at least one repeating section configured to emit light of a predetermined wavelength.

The pattern of the quantum dot polymer composite may include a repeating section of a first section that may emit a first light, a second section that may emit a second light, or a combination thereof.

The first light and the second light have a different maximum photoluminescence peak wavelength in a photoluminescence spectrum. In an embodiment, the first light (R) may be red light present at a maximum photoluminescence peak wavelength of about 600 nm to about 650 nm (e.g., about 620 nm to about 650 nm), the second light (G) may be green light present at a maximum photoluminescence peak wavelength of about 500 nm to about 550 nm (e.g., about 510 nm to about 550 nm), or vice versa (i.e., the first light may be a green light and the second light may be a red light).

A pattern of the quantum dot polymer composite may include a third section that may emit or transmit a third light different from the first and the second lights (e.g., blue light). The maximum peak wavelength of the third light may be greater than or equal to about 380 nm, greater than or equal to about 420 nm, greater than or equal to about 430 nm, greater than or equal to about 440 nm, or greater than or equal to about 445 nm and less than or equal to about 480 nm, less than or equal to about 470 nm, less than or equal to about 460 nm, or less than or equal to about 455 nm. The light source may emit the third light.

In a display device of an embodiment, a patterned film of the quantum dot polymer composite may include a first section emitting red light and a second section emitting green light, and the light source may emit blue light. On front surfaces (i.e., light extraction side) of the first and the second sections, an optical element that may block (e.g., reflect or absorb) blue light may be disposed.

The substrate may be a substrate including an insulation material. The substrate may include a material such as glass; various polymers such as a polyester (e.g., poly(ethylene terephthalate) (PET), poly(ethylene naphthalate) (PEN), or the like), a polycarbonate, a poly(C1 to C10 alkyl (meth) acrylate), a polyimide, a polyamide, or a combination thereof (e.g., a copolymer or a mixture thereof); a polysiloxane (e.g., polydimethylsiloxane (PDMS)); an inorganic material such as $Al_2O_3$ or ZnO; or a combination thereof, but is not limited thereto. A thickness of the substrate may be desirably selected considering a substrate material but is not particularly limited. The substrate may have flexibility. The substrate may have a transmittance of greater than or equal to about 50%, greater than or equal to about 60%, greater than or equal to about 70%, greater than or equal to about 80%, or greater than or equal to about 90% for light emitted from the quantum dot.

At least a portion of the substrate may have an additional element that is configured to cut (absorb or reflect) blue light. A layer capable of blocking (e.g., absorbing or reflecting) blue light, also referred to herein as a "blue cut layer" or "blue light absorption layer," may be disposed on at least one surface of the substrate. For example, a blue cut layer (blue light absorption layer) may include an organic material and a predetermined dye, such as, for example, a yellow dye or a dye capable of absorbing blue light and transmitting green and/or red light.

In an embodiment, a method of producing the stacked structure includes forming a film of the above composition on a substrate;

exposing a selected region of the film to light (e.g., having a wavelength of less than or equal to about 400 nm); and developing the exposed film with an alkali developing solution to obtain a pattern of the quantum dot polymer composite.

Details of the substrate and the composition are the same as described above.

Figure 2:
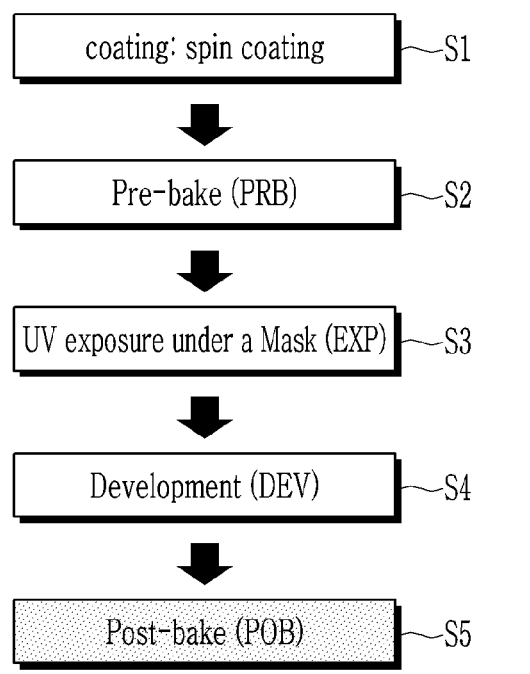
FIG. 2 shows a process of producing a quantum dot polymer composite pattern using a composition according to an embodiment.
Figure 2:
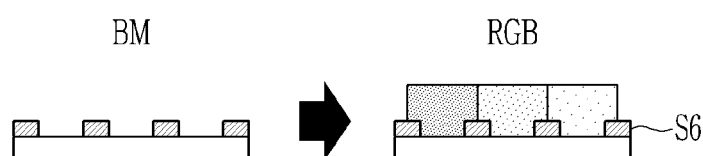

A non-limiting method of forming a pattern of the quantum dot polymer composite is explained with reference to FIG. 2.

The composition is coated to have a predetermined thickness on a substrate in an appropriate method of spin coating, slit coating, or the like (S1). If desired, the formed film may be pre-baked (S2). Conditions (such as a temperature, duration, or an atmosphere) for the pre-baking may be selected appropriately.

The formed (and optionally, pre-baked) film is exposed to light of a predetermined wavelength (UV light) under a mask having a predetermined pattern (S3). The wavelength and the intensity of light may be selected depending on the types and the amounts of the photoinitiator, the types and the amounts of quantum dots, or the like.

The film having the exposed selected area is treated (e.g., sprayed or immersed) with an alkali developing solution (S4), and thereby the unexposed region in the film is dissolved to provide a desired pattern. The obtained pattern may be post-baked (S5), if desired, to improve crack resistance and solvent resistance of the pattern, for example, at a temperature of about 150° C. to about 230° C. for a predetermined time, for example, greater than or equal to about 10 min or greater than or equal to about 20 min.

When the quantum dot-polymer composite pattern has a plurality of repeating sections, a quantum dot-polymer composite having a desired pattern may be obtained by preparing a plurality of compositions including a quantum dot (e.g., a red light emitting quantum dot, a green quantum dot, or optionally, a blue quantum dot) having desired photoluminescence properties (a photoluminescence peak wavelength or the like) to form each repeating section and repeating the pattern formation process for each of the composition as many times (e.g., two or more times or three or more times) as desired to form a desired pattern of the quantum dot polymer composite (S6).

For example, the quantum dot-polymer composite may be in the form of a pattern of at least two different repeating color sections (e.g., RGB sections). Such a quantum dot-polymer composite pattern may be used as a photoluminescence-type color filter in a display device.

In an embodiment, the aforementioned stacked structure may be formed by using an ink composition that includes the quantum dots and the liquid vehicle. In such a method, a proper system (e.g., a liquid discharge device such as an ink jet or a nozzle printing device) is used to deposit the ink composition on a desired substrate or an organic light emitting device (e.g., blue OLED) with a desired pattern, which is then heated for the removal of the solvent and the polymerization. The ink jet process may provide a highly precise quantum dot polymer composite film or pattern within a short period of time in a simple manner In a display device that includes a light source and a light emitting element including a stacked structure, the light source may be configured to provide incident light to the light emitting element including the stacked structure. The incident light may have a wavelength of about 440 nm to about 480 nm such as about 440 nm to about 470 nm. The incident light may be the third light.

For example, each light emitting unit of the light source may include an electroluminescent device (e.g., an organic light emitting diode (OLED)) configured to emit light of a predetermined wavelength (e.g., blue light, green light, or a combination thereof). Structures and materials of the electroluminescent device and the organic light emitting diode (OLED) are not particularly limited and may be selected appropriately.

Figure 3A:
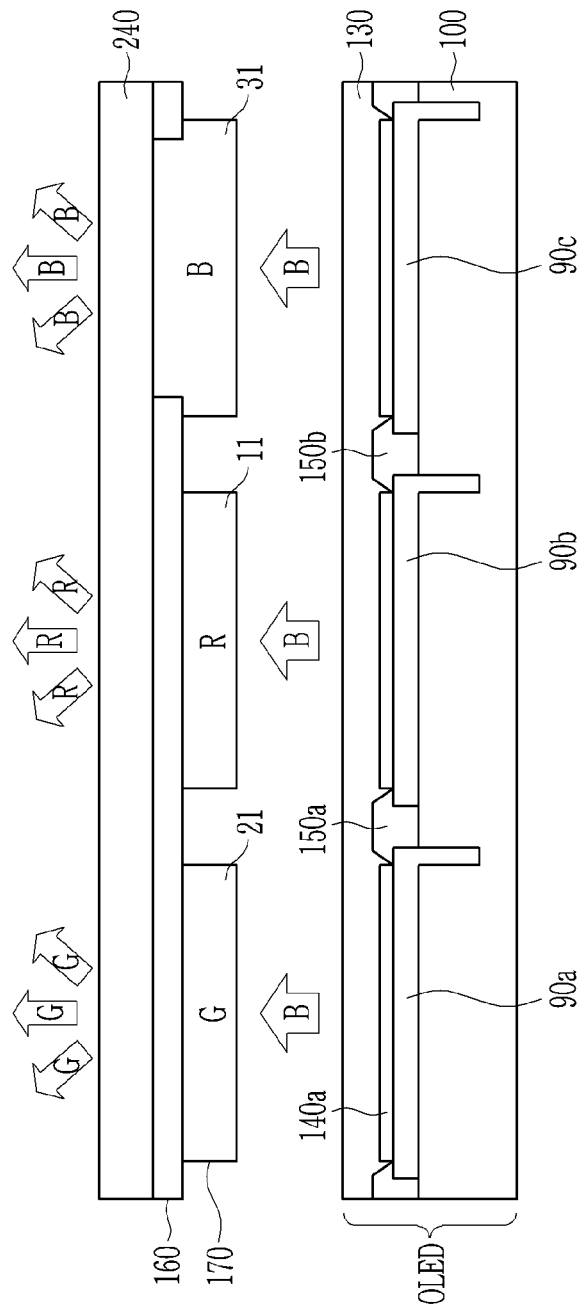
FIG. 3A is a cross-sectional view of a device according to an embodiment.
Figure 3B:
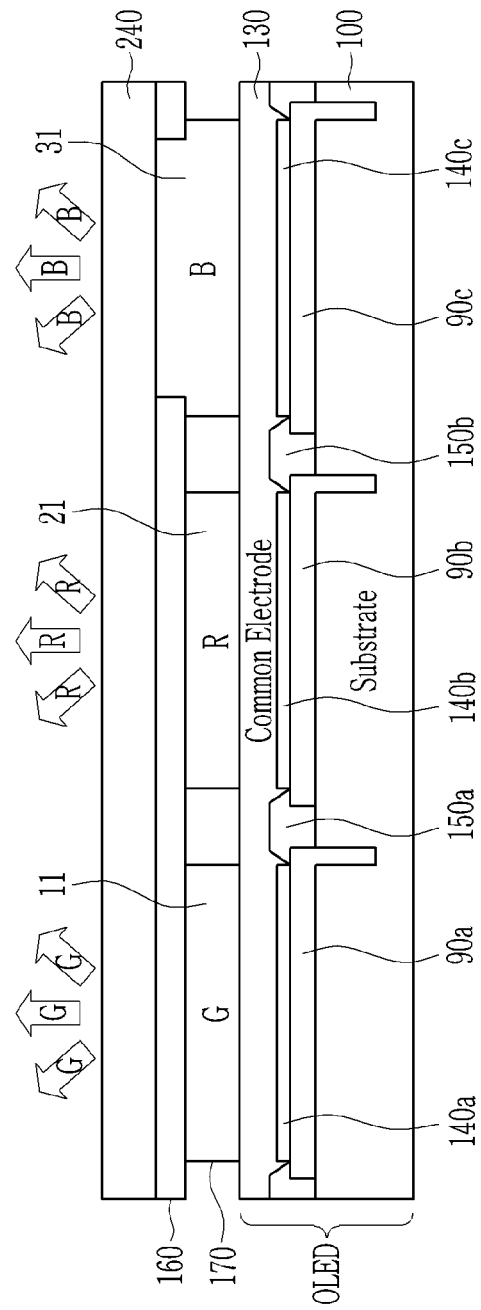
FIG. 3B is a cross-sectional view of a device according to an embodiment.

FIG. 3A and FIG. 3B show a schematic cross-sectional view of a display of an embodiment of a layered structure. Referring to FIG. 3A and FIG. 3B, the light source may include an organic light emitting diode OLED. For example, the OLED may emit blue light or a light having a wavelength in a region of about 500 nm or less.

Details of the organic light emitting diode OLED are the same as set forth above. The OLED may include (at least two) pixel electrodes 90a, 90b, 90c formed on a substrate 100, a pixel defining layer 150a, 150b formed between the adjacent pixel electrodes 90a, 90b, 90c, an organic light emitting layer 140a, 140b, 140c formed on the pixel electrodes 90a, 90b, 90c, and a common electrode layer 130 formed on the organic light emitting layer 140a, 140b, 140c.

The pixel areas of the OLED may be disposed corresponding to the first, second, and third sections that will be described in detail below, respectively.

The stacked structure that includes a quantum dot-polymer composite pattern 170 (e.g., including a first repeating section including green light emitting quantum dots, a second repeating section including red light emitting quantum dots, or a combination thereof) and a substrate, or the quantum dot-polymer composite pattern 170, may be disposed on or over a light source, for example, directly on the light source.

The light (e.g., blue light) emitted from the light source may enter the second section 21 and the first section 11 of the pattern to emit (e.g., converted) red light R and green light G, respectively. Blue light B emitted from the light source passes through or transmits from the third section 31. Over the second section 21 emitting red light, the first section 11 emitting green light, or a combination thereof, an optical element 160 may be disposed. The optical element may be a blue cut layer which cuts (e.g., reflects or absorbs) blue light and optionally green light, or a first optical filter. The blue cut layer 160 may be disposed on the upper substrate 240. The blue cut layer 160 may be disposed between the upper substrate 240 and the quantum dot-polymer composite pattern 170 and over the first section 11 and the second section 21. Details of the blue cut layer are the same as set forth for the first optical filter 310 below.

The aforementioned device may be fabricated by separately preparing the layered structure and the OLED (for example, a blue OLED), respectively, and combining them. Alternatively, the device may be fabricated by directly forming the pattern of the quantum dot-polymer composite over the OLED.

In an embodiment, the display device may further include a lower substrate 210, an optical element (e.g., polarizer) 300 disposed below the lower substrate 210, and a liquid crystal layer 220 interposed between the layered structure and the lower substrate 210. The layered structure may be disposed in such a manner that a light emitting layer (i.e., the quantum dot-polymer composite pattern 170) faces the liquid crystal layer. The display device may further include an optical element (e.g., polarizer) 300 between the liquid crystal layer 220 and the light emitting layer. The light source may further include an LED and optionally a light guide panel.

Figure 4:
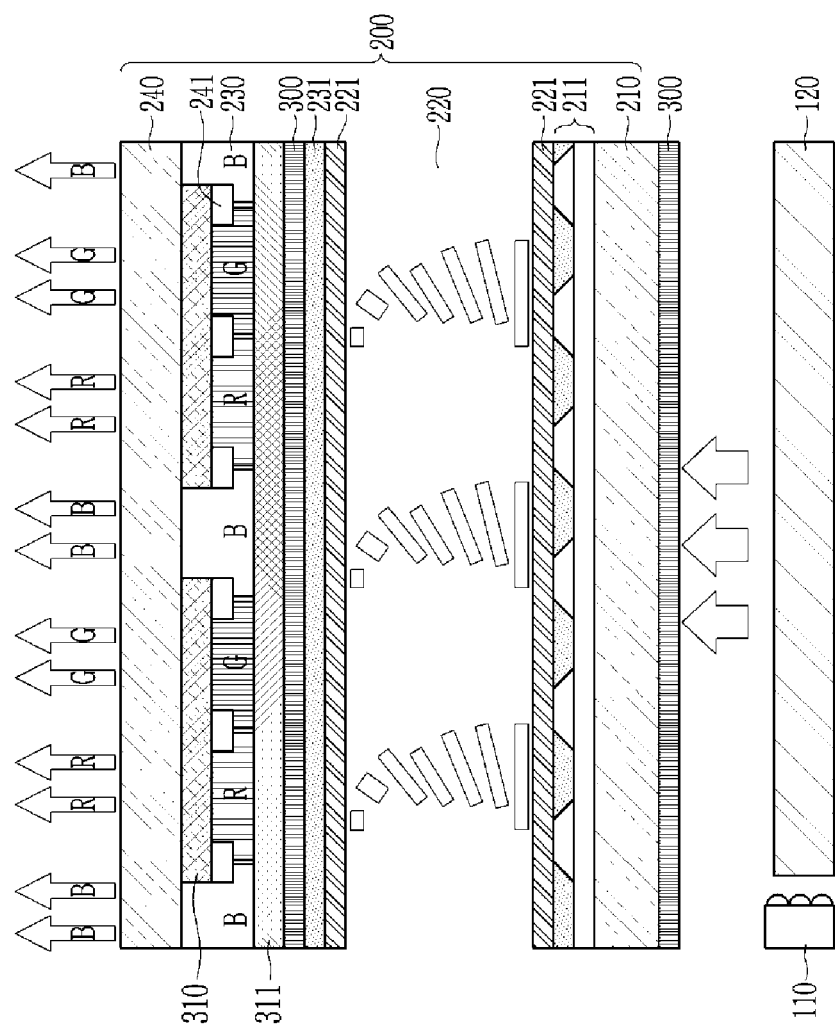
FIG. 4 is a cross-sectional view of a device according to an embodiment.

FIG. 4 is a schematic view of a liquid crystal display device of an embodiment. Referring to FIG. 4, in an embodiment, the display device includes a liquid crystal panel 200, an optical element 300 (e.g., polarizer) disposed on the liquid crystal panel 200, under the liquid crystal panel 200, or a combination thereof, and a backlight unit including a blue light emitting light source 110 under a lower optical element 300. The backlight unit may include a light source 110 and a light guide 120 (edge type). Alternatively, the backlight unit may be a direct light source without a light guide panel.

The liquid crystal panel 200 may include a lower substrate 210, a (e.g., transparent and insulative) upper substrate 240, and a liquid crystal layer 220 between the upper and lower substrates, and a light emitting layer (color filter layer) 230 disposed on or under the upper substrate 240. The light emitting layer 230 may include the quantum dot-polymer composite (or a pattern thereof).

The lower place 210 may be made of a transparent and insulative material. Details of the substrate are the same as set forth above. A wire plate 211 is provided on an internal surface, for example, on the upper surface of the lower substrate 210. The wire plate 211 may include a plurality of gate wires and data wires that define a pixel area, a thin film transistor disposed adjacent to a crossing region of gate wires and data wires, and a pixel electrode for each pixel area, but is not limited thereto. Details of the wire plate are not particularly limited and may be selected appropriately.

The liquid crystal layer 220 may be disposed on the wire plate 211. The liquid crystal layer 220 may include an alignment layer 221 on an upper surface of the liquid crystal layer 220 and on a lower surface of the liquid crystal layer 220, to initially align the liquid crystal material included therein. Details regarding a liquid crystal material, an alignment layer material, a method of forming an alignment layer, a method of forming a liquid crystal layer, a thickness of liquid crystal layer, or the like are not particularly limited and may be selected appropriately.

In an embodiment, an upper optical element or an upper polarizer 300 may be provided between the liquid crystal layer 220 and the upper substrate 240, but it is not limited thereto. For example, the upper optical element or polarizer 300 may be disposed between the liquid crystal layer 220 (or a common electrode 231) and the light emitting layer (or the quantum dot-polymer composite pattern). The upper polarizer may be disposed on or over the transparent substrate 240. The polarizer may be any suitable polarizer that can be used in a liquid crystal display device. The polarizer may be TAC (triacetyl cellulose) having a thickness of less than or equal to about 200 μm, but is not limited thereto. In an embodiment, the upper optical element may be a coating that controls a refractive index without a polarization function.

The backlight unit may include a light guide panel 120. In an embodiment, the backlight unit may be an edge-type lighting. For example, the backlight unit may include a reflector, a light guide provided on the reflector and providing a planar light source with the liquid crystal panel 200, at least one optical sheet on the light guide, for example, a diffusion plate, a prism sheet, or the like, or a combination thereof, but is not limited thereto.

The backlight unit may not have a light guide panel. In an embodiment, the backlight unit may be a direct-type lighting. For example, the backlight unit may have a reflector, and may have a plurality of fluorescent lamps disposed on the upper side of the reflector at regular intervals, or may have an LED operating substrate on which a plurality of light emitting diodes are disposed, and over them, a diffusion plate and optionally at least one optical sheet may be provided. Details (e.g., each components of light guide and various optical sheets, a reflector, or the like) of such a backlight unit are known and are not particularly limited.

A black matrix 241 may be provided under the upper substrate 240 (e.g., on a lower surface thereof). Openings within the black matrix 241 are aligned with (or provided to hide) a gate line, a data line, and a thin film transistor of a wire plate 211 on the lower substrate 210. A second section (R) including a color filter emitting red light, a first section (G) including a color filter emitting green light, a third section (B) including a color filter for emitting or transmitting blue light, or a combination thereof may be disposed in the openings within the black matrix 241 (BM). For example, the black matrix 241 may have a lattice shape. If desired, the light emitting layer may further include at least one fourth repeating section. The fourth section may be configured to emit light having a color (e.g., cyan, magenta, yellow, or the like) different from the colors of the light emitted from the first to third sections.

In the light emitting layer 230, the sections forming the pattern may be repeated corresponding to the pixel area formed on the lower substrate. The light emitting layer (color filter layer) 230 may be on a transparent common electrode 231.

The third section (B) configured to emit/transmit blue light may be a transparent color filter that does not change a light emitting spectrum of the light source. Blue light emitted from the backlight unit may pass the polarizer and the liquid crystal layer and then enter as a polarized light and go out as it is. If desired, the third section may include quantum dots emitting blue light.

If desired, the display device may further include a blue cut filter, hereinafter, also referred to as a first optical filter layer. The blue cut filter 310 may be disposed between upper surfaces of the second section (R) and the first section (G) and the lower surface of the upper substrate 240, or on an upper surface of the upper substrate (240). The blue cut filter 310 may include a sheet having openings that correspond to the third section (B) (e.g., a pixel area showing, e.g., emitting, a blue color) and may be formed on portions corresponding to the first and second sections (G, R). The first optical filter layer 310 may be formed as a single body structure over the portions of the light emitting layer 230 corresponding to the first and second sections (G, R), and which are other than the portions overlapping the third section, but is not limited thereto. Alternatively, at least two first optical filter layers may be spaced apart from each other and may be disposed over each of the portions overlapping the first and the second sections, respectively.

For example, the first optical filter layer may block light having a predetermined wavelength range in the visible light range and may transmit light having another wavelength range. For example, the first optical filter layer may block blue light and transmit light other than blue light. For example, the first optical filter layer may transmit green light, red light, or yellow light (e.g., the mixed light of the green light and the red light).

The first optical filter layer may include a polymer thin film including a dye, a pigment, or a combination thereof that absorbs light having a specific wavelength, i.e., the wavelength to be blocked. The first optical filter layer may block at least 80%, or at least 90%, even at least 95% of blue light having a wavelength of less than or equal to about 480 nm. With respect to the visible light having other wavelengths, the first optical filter layer may have a light transmittance of greater than or equal to about 70%, for example, greater than or equal to about 80%, greater than or equal to about 90%, or even up to 100%.

The first optical filter layer may absorb and substantially block blue light having a wavelength of less than or equal to about 500 nm, and for example, may selectively transmit green light or red light. At least two first optical filter layers may be spaced apart and disposed on each of the portions overlapping the first and second sections, respectively. For example, the first optical filter layer selectively transmitting red light may be disposed on the portion overlapping the section emitting red light and the first optical filter layer selectively transmitting green light may be disposed on the portion overlapping the section emitting green light.

In an embodiment, the first optical filter layer may include a first region, a second region, or a combination thereof. The first region of the first optical filter layer blocks (e.g., absorbs) blue light and red light and transmits light having a wavelength of a predetermined range, e.g., a wavelength greater than or equal to about 500 nm, greater than or equal to about 510 nm, or greater than or equal to about 515 nm, and less than or equal to about 550 nm, less than or equal to about 540 nm, less than or equal to about 535 nm, less than or equal to about 530 nm, less than or equal to about 525 nm, or less than or equal to about 520 nm. The second region of the first optical filter layer blocks (e.g., absorb) blue light and green light and transmits light having a wavelength of a predetermined range, e.g., a wavelength of greater than or equal to about 600 nm, greater than or equal to about 610 nm, or greater than or equal to about 615 nm and less than or equal to about 650 nm, less than or equal to about 640 nm, less than or equal to about 635 nm, less than or equal to about 630 nm, less than or equal to about 625 nm, or less than or equal to about 620 nm. The first region of the first optical filter layer may be disposed (directly) on or over a location overlapping a green light emitting section and the second region of the first optical filter layer may be disposed (directly) on or over a location overlapping a red light emitting section. The first region and the second region may be optically isolated from one another, for example, by a black matrix. The first optical filter layer may contribute to improving the color purity of a display device.

The first optical filter layer may be a reflection type filter including a plurality of layers (e.g., inorganic material layers) each having a different refractive index. For example, in the first optical filter layer, two layers having different refractive indices may be alternately stacked on each other. For example, a layer having a high refractive index and a layer having a low refractive index may be alternately laminated with each other.

In the first optical filter layer, a thickness of the layer having a high refractive index and a thickness of the layer having a low refractive index and the stacked number thereof may be determined depending upon a refractive index of each layer and the wavelength to be reflected. In an embodiment, for example, each layer having a high refractive index in the first optical filter layer may have a thickness in a range of about 3 nm to about 300 nm, and each layer having a low refractive index in the first optical filter layer may have a thickness in a range of about 3 nm to about 300 nm.

A total thickness of the first optical filter layer may be in a range of, for example, about 3 nm to about 10,000 nm, about 300 nm to about 10,000 nm, or about 1,000 nm to about 10,000 nm. Each of the layer having a high refractive index and the layer having a low refractive index in the first optical filter layer may have a same thickness and material as each other or different thicknesses and materials from each other.

The display device may further include a second optical filter layer 311 (e.g., red/green light or yellow light recycling layer) that is disposed between the light emitting layer 230 and the liquid crystal layer 220, and between the light emitting layer 230 (e.g., the quantum dot polymer composite layer) and the upper polarizer 300. The second optical filter layer 311 may transmit at least a portion of a third light, and reflect at least a portion of a first light, a second light, or a combination thereof. The second optical filter layer may reflect light having a wavelength of greater than 500 nm. The first light may be green (or red) light, the second light may be red (or green) light, and the third light may be blue light.

In an embodiment the display device, the second optical filter layer may be formed directly under the second planarization layer to provide a relatively planar surface.

In an embodiment, the second optical filter layer may include a monolayer having a low refractive index. In an embodiment, for example, the second optical filter layer may be a transparent thin film having a refractive index of less than or equal to about 1.4, less than or equal to about 1.3, or less than or equal to about 1.2.

The second optical filter layer having a low refractive index may include, for example, a porous silicon oxide, a porous organic material, a porous organic/inorganic composite, or a combination thereof.

In an embodiment, the second optical filter layer may include a plurality of layers having different refractive indexes from each other. In an embodiment, for example, the second optical filter layer may be formed by alternatively stacking two layers having different refractive indexes from each other, or may be formed by alternatively stacking a material having a high refractive index and a material having a low refractive index.

The layer having a high refractive index in the second optical filter layer may include, for example, hafnium oxide, tantalum oxide, titanium oxide, zirconium oxide, magnesium oxide, cesium oxide, lanthanum oxide, indium oxide, niobium oxide, aluminum oxide, silicon nitride, or a combination thereof, but not being limited thereto. In such an embodiment, the layer having a high refractive index in the second optical filter layer may include another material having a higher refractive index than the layer having a low refractive index in the second optical filter layer.

The layer having a low refractive index in the second optical filter layer may include, for example, a silicon oxide, but not being limited thereto. In such an embodiment, the layer having a low refractive index in the second optical filter layer may include another material having a lower refractive index than the layer having a high refractive index in the second optical filter layer.

As the refractive index difference between the layer having a high refractive index and the layer having a low refractive index is the higher, the second optical filter layer may have the higher selectivity to a wavelength.

In the second optical filter layer, each thickness of the layer having a high refractive index and the layer having a low refractive index and the stacked number thereof may be determined depending upon a refractive index of each layer and the wavelength to be reflected.

In one embodiment, for example, each layer having a high refractive index in the second optical filter layer may have a thickness in a range of about 3 nm to about 300 nm, and each layer having a low refractive index in the second optical filter layer may have a thickness in a range of about 3 nm to about 300 nm. The total thickness of the second optical filter layer may be in a range of, for example, about 3 nm to about 10,000 nm, about 300 nm to about 10,000 nm, or about 1,000 nm to about 10,000 nm. Each of the layer having a high refractive index and the layer having a low refractive index in the second optical filter layer may have a same thickness and material as each other or different thicknesses and materials from each other.

In an embodiment, the second optical filter layer reflects at least a portion of the first light R and the second light G and transmits at least a portion (e.g., entire) of the third light B. In an embodiment, the second optical filter layer may transmit only the third light B in a blue light wavelength region or a wavelength region of less than or equal to about 500 nm, and light in a wavelength region of greater than about 500 nm, which is a green light G, a yellow light, a red light R or the like, may not be passed through the second optical filter layer but be reflected. Thus, the reflected green and red lights may pass through the first and the second sections to be emitted to the outside of the display device 10.

The second optical filter layer may reflect the light in a wavelength region of greater than about 500 nm with a reflectance of greater than or equal to about 70%, greater than or equal to about 80%, or greater than or equal to about 90%, or even about 100%.

In an embodiment, the second optical filter layer may transmit the light in a wavelength region of less than or equal to about 500 nm with a transmittance of, for example, greater than or equal to about 90%, greater than or equal to about 92%, greater than or equal to about 94%, greater than or equal to about 96%, greater than or equal to about 98%, greater than or equal to about 99%, or even about 100%.

The display device may have improved brightness (for example, of greater than or equal to about 100 nit (candelas per square meter, cd/m$^2$) and a wide viewing angle (for example, of about 160 degrees or greater).

An embodiment provides an electronic device including the quantum dot. The device may include a light emitting diode (LED), an organic light emitting diode (OLED), a sensor, a solar cell, an imaging sensor, or a liquid crystal display (LCD), but is not limited thereto.

In an embodiment, the electronic device may be an electroluminescent device. In the EL device, a light emitting layer including a plurality of the aforementioned quantum dots may be disposed between an anode and a cathode facing each other.

Figure 5:
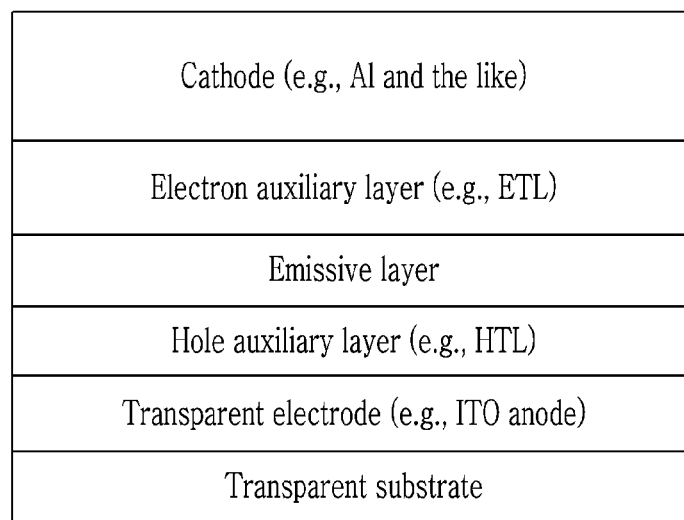
FIG. 5 is a schematic cross-sectional view showing an electroluminescent device according to an embodiment.

In an embodiment, the anode, the cathode, or a combination thereof (e.g., disposed on a transparent substrate) may include a metal oxide transparent electrode (e.g., ITO electrode). The anode, the cathode, or a combination thereof (e.g., disposed on a transparent substrate) may include a metal (Mg, Al, etc.) having a predetermined (e.g., relatively low) work function. For example, poly(3,4-ethylenedioxythiophene):poly(styrenesulfonate (PE DOT: PSS), a p-type metal oxide, poly(9,9-dioctyl-fluorene-co-N-(4-butylphenyl)-diphenylamine) (TFB), poly(N-vinylcarbazole) (PVK), or a combination thereof may be disposed between the transparent electrode and the light emitting layer, as a hole injection layer, a hole transport layer HTL, or a combination thereof, respectively. An electron auxiliary layer (e.g., electron transport layer) may be disposed between the light emitting layer and the cathode (see FIG. 5).

A device according to an embodiment may have an inverted structure. Herein, a cathode disposed on a transparent substrate may include a metal oxide transparent electrode (e.g., ITO, fluorine doped tin oxide (FTO)) and an anode facing the cathode may include a metal (e.g., Au, Ag, etc.) of a predetermined (e.g., relatively high) work function. For example, an n-type metal oxide (ZnO) may be disposed between the transparent electrode and the light emitting layer as an electron auxiliary layer (e.g., an electron transport layer). MoO$_3$ or another p-type metal oxide may be disposed between the metal anode and the light emitting layer as a hole auxiliary layer (e.g., a hole injection layer) The TFB, the PVK, or a combination thereof may be disposed between the transparent electrode and the light emitting layer as a hole transport layer (HTL). (see FIG. 6).

Hereinafter, embodiments are illustrated in more detail with reference to examples. However, the present disclosure is not limited thereto.

EXAMPLES

Analysis Method

1. Ultraviolet (UV)-Visible Absorption Analysis

An Agilent Cary5000 spectrometer is used to perform a UV spectroscopy analysis and UV-Visible absorption spectrum is obtained.

2. Photoluminescence Analysis

Photoluminescence Analysis is done using Hitachi F-7000 spectrometer and a photoluminescence spectrum is obtained.

3. Relative Quantum Yield (QY) of the Quantum Dot

For the synthesized quantum dot, a relative PL (photoluminescence) QY (quantum yield) is obtained as below.

$$QY = QY_R * OD_R/OD_{sample} * I_{sample}/I_R * (n_{sample})^2/(n_R)^2$$

OD: optical density (determined by the absorption intensity in a UV-Vis absorption spectroscopic analysis)

I: Integrated intensity (calculated by the integration of the luminescent peak on a PL spectrum)

n: refractive index of solvent

R: reference dye (e.g., coumarin (green) or rhodamine 6G (red))

Sample: the QD sample as synthesized

4. ICP Analysis

An inductively coupled plasma-atomic emission spectroscopy (ICP-AES) analysis is performed using Shimadzu ICPS-8100.

5. Brightness and Luminous Efficiency of Quantum Dot Polymer Composite (1) Brightness of the composite is measured as below:

Quantum dot—polymer composite film is inserted between the light guide panel and an optical film of a 60 inch television (TV) equipped with a blue light emitting diode (LED) having a peak wavelength of 449 nanometers (nm). Then, the brightness of the quantum dot—polymer composite film is measured using a spectro-radiometer (PSI DARSA-5200) placed 45 centimeters in front of the TV when the TV is turned on.

Quantum dot—polymer composites are prepared by separating the quantum dots from a quantum dot dispersion via the non-solvent precipitation and centrifugation. The separated quantum dots are mixed with a monomer or polymer (e.g., an acrylic polymer, a thiolene polymer or a mixture thereof) to obtain a mixture, which is then applied on a substrate and a barrier film is covered thereon and a resulting structure is cured.

The obtained composite film is placed on an integrating sphere and an excitation light having a wavelength of 450 nm is irradiated thereto to measure a conversion efficiency of the composite film. The photoconversion efficiency is explained above.

6. TEM Analysis

A transmission electron microscopic (TEM) analysis is performed using Titan ChemiSTEM electron microscope.

Preparation of Core

Example 1

Selenium is dispersed in trioctylphosphine (TOP) to obtain a Se/TOP stock solution.

Indium acetate, zinc acetate, and palmitic acid are dissolved in 1-octadecene in a 200 milliliter (mL) reaction flask, subjected to a vacuum state at 120° C. for one hour. A mole ratio of indium:zinc:palmitic acid is 1:1:3. The atmosphere in the flask is exchanged with $N_2$. After the reaction flask is heated to 200° C., a trioctylphosphine (TOP) solution of tris(trimethylsilyl)phosphine ($TMS_3P$) and the Se/TOP stock solution is quickly injected, and the reaction proceeds at 300° C. for 10 minutes.

The reaction mixture then is rapidly cooled to room temperature and acetone is added thereto to produce nanocrystals, which are then separated by centrifugation and dispersed in toluene to obtain a toluene dispersion of the InPZnS cores.

The amount of the selenium is about 0.2 moles per one mole of zinc. The results of the TEM analysis confirm that the size of the InPZnS cores thus obtained is about 2.5 nm on average.

Figure 7:
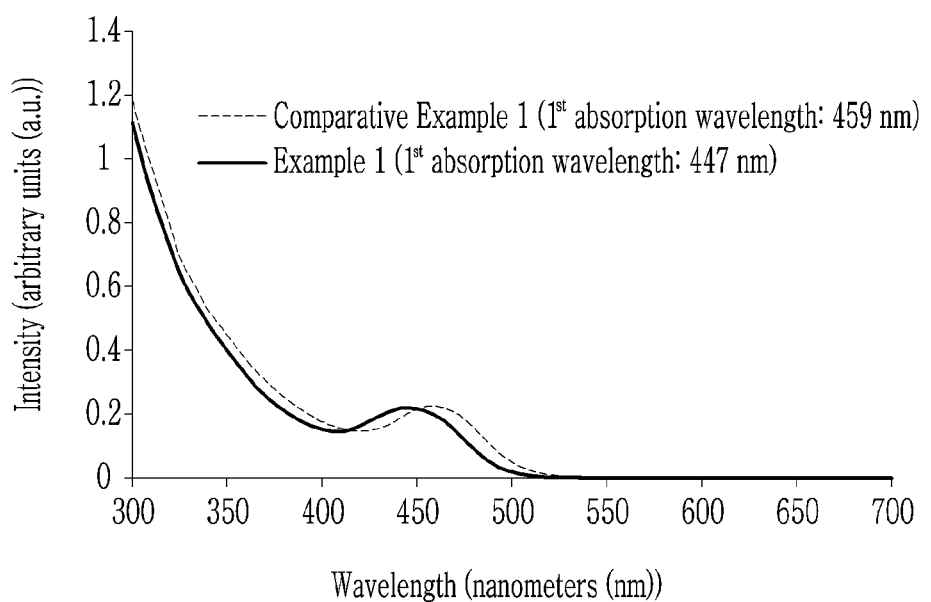
FIG. 7 is a UV-Vis absorption spectrum showing intensity (arbitrary units (a.u.)) versus wavelength (nanometers (nm)) of the quantum dots prepared in Example 1 and Comparative Example 1.

For the InPZnS cores, an ICP-AES analysis and a UV-Vis absorption spectroscopic analysis are conducted and the results are shown in Table 1 and FIG. 7.

Comparative Example 1

In a 200 mL reaction flask, indium acetate, zinc acetate, and palmitic acid are dissolved in 1-octadecene and the resulting solution is subjected to vacuum at 120° C. for 10 minutes. A ratio of the indium with respect to the palmitic acid is 1:3. The atmosphere in the flask is replaced with $N_2$. While the resulting solution is heated to about 200° C., a trioctylphosphine (TOP) solution of tris(trimethylsilyl)phosphine ($TMS_3P$) is quickly injected.

Then, a temperature is raised to 270° C. and kept for 10 minutes to synthesize a core. Then, the Se/TOP stock solution is injected thereto and a temperature of the reaction flask is kept at 300° C. for 10 minutes to form a ZnSe shell on the synthesized core.

The reaction mixture then is rapidly cooled to room temperature and acetone is added thereto to produce nanocrystals, which are then separated by centrifugation and dispersed in toluene.

The amount of the selenium is about 0.2 moles per one mole of zinc. The results of the TEM analysis confirm that the size of the core thus obtained is about 2.3 nm on average.

For the InP/ZnSe particles, an ICP-AES analysis and a UV-Vis absorption spectroscopic analysis are conducted and the results are shown in Table 1 and FIG. 7.

TABLE 1

| | mole ratio | | | |
|---|---|---|---|---|
| | P:In | Zn:In | Se:In | In:In |
| Example 1 | 0.67:1 | 0.35:1 | 0.18:1 | 1.00:1 |
| Comparative Example 1 | 0.67:1 | 0.44:1 | 0.18:1 | 1.00:1 |

The results of Table 1 and FIG. 7 confirm that the quantum dots prepared in Example 1 and Comparative Example 1 have the similar composition, but in the case of the alloy core of Example 1 has a $1^{st}$ absorption peak that is blue-shifted in comparison with that of the core/shell quantum dot of Comparative Example 1.

Alloy Core/Shell Quantum Dot

Example 2

Selenium and sulfur are dispersed in trioctylphosphine (TOP) to obtain a Se/TOP stock solution and a S/TOP stock solution, respectively.

In a 200 mL reaction flask, zinc acetate and oleic acid are dissolved in trioctyl amine and the solution is subjected to vacuum at 120° C. for 10 minutes. The atmosphere in the flask is replaced with $N_2$. While the resulting solution is heated to about 320° C., a toluene dispersion of the alloy core prepared in Example 1 is injected thereto and the Se/TOP stock solution and the S/TOP stock solution are injected into the reaction flask. A reaction is carried out to obtain a reaction solution including a particle having a ZnSeS shell disposed on the alloy core.

Then, at the aforementioned reaction temperature, the S/TOP stock solution is injected to the reaction mixture. A reaction is carried out to obtain a resulting solution including a particle having a ZnS based shell disposed on the ZnSeS shell.

An excess amount of ethanol is added to the final reaction mixture including the InPZnSe/ZnSeS/ZnS quantum dots, which are then centrifuged. After centrifugation, the supernatant is discarded, and the precipitate is dried and dispersed in chloroform to obtain a quantum dot solution (hereinafter, QD solution).

For the obtained QD solution, an ICP-AES analysis is made and the results are shown in Table 2. A photoluminescence spectroscopic analysis is made for the QD solution, and the results are shown in Table 3.

Comparative Example 2

A ZnSeS/ZnS shell is formed in the same manner as in Example 2 except for using a core prepared in the same manner of Comparative Example 1. For the obtained QD solution, an ICP-AES analysis is made and the results are shown in Table 2. A photoluminescence spectroscopic analysis is made for the QD solution, and the results are shown in Table 3.

TABLE 2

| | mole ratio (ICP data) | | | | |
|---|---|---|---|---|---|
| Sample | P:In | S:In | Zn:In | Se:In | In:In |
| Example 2 | 0.79:1 | 16.64:1 | 38.43:1 | 14.57:1 | 1.00:1 |
| Comparative Example 2 | 0.79:1 | 16.43:1 | 38.29:1 | 14.93:1 | 1.00:1 |

TABLE 3

| | composition | Photo-luminescence (PL) Peak Wavelength (nm) | Full Width at Half Maximum (FWHM) (nm) | QY (%) |
|---|---|---|---|---|
| Comparative Example 2 | InP/ZnSeS/ZnS | 539 | 41 | 66 |
| Example 2 | InPZnSe/ZnSeS/ZnS | 536 | 41 | 86 |

The results of Table 3 confirm that the quantum dots of Example 2 show significantly improved QY in comparison with the quantum dots of Comparative Example 2.

Example 3: Quantum Dot Polymer Composite I

A toluene dispersion of the alloy core prepared in Example 1 is added to a monomer/oligomer mixture prepared as below to obtain a composition, 1 gram (g) of which is drop casted on a glass substrate:

30 parts by weight of a lauryl methacrylate monomer, 36 parts by weight of a tricyclodecane dimethanol diacrylate monomer, 4 parts by weight of a trimethylol propane triacrylate monomer, 20 parts by weight of an epoxy diacrylate oligomer (purchased from Sartomer) are mixed to obtain a monomer/oligomer mixture. 1 part by weight of 1-hydroxycyclohexyl-phenyl-ketone, and 1 part by weight of 2,4,6-trimethylbenzoyl-diphenyl-phosphine oxide are added thereto to obtain a final mixture, which is then defoamed under vacuum.

The casted composition is covered with a poly(ethylene terephthalate) (PET) film and is UV-cured with a light intensity of 100 milliwatts per square centimeter (mW/cm$^2$) for four minutes to produce a semiconductor-polymer composite film. For the obtained film, brightness is measured and the results are summarized in Table 4.

Comparative Example 3

A quantum dot polymer composite is prepared in the same manner as in Example 3 except for using the core-shell quantum dots prepared in Comparative Example 1.

TABLE 4

| | Film brightness (%) |
|---|---|
| Example 3 | 53.3 |
| Comparative Example 3 | 54.5 |

The results of Table 4 confirm that the quantum dots of Example 1 may show increased brightness and improved chemical stability in a composite film.

Example 4: Pattern of a Quantum Dot Polymer Composite (1) A dispersion of the quantum dots prepared in Example 2 is mixed with a solution of a binder polymer, which is a four membered copolymer of methacrylic acid, benzyl methacrylate, hydroxyethyl methacrylate, and styrene, (acid value: 130 milligrams (mg) per gram of KOH (mg KOH/g), molecular weight: 8,000 grams per mole (g/mol), acrylic acid:benzyl methacrylate:hydroxyethyl methacrylate:styrene (molar ratio)=61.5%:12%:16.3%:10.2%) (solvent: propylene glycol monomethyl ether acetate (PGMEA), a concentration of 30 percent by weight (wt %)) to form a quantum dot-binder dispersion.

To the quantum dot-binder dispersion prepared above, a hexaacrylate having the following structure (as a photopolymerizable monomer), ethylene glycol di-3-mercaptopropionate (hereinafter, 2T, as a multi-thiol compound), an oxime ester compound (as an initiator), TiO$_2$ as a metal oxide fine particle, and PGMEA (as a solvent) are added to obtain a photosensitive composition.

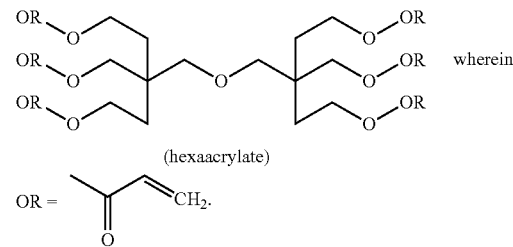

Based on a total solid content, the prepared composition includes 40 wt % of quantum dots, 12.5 wt % of the binder polymer, 25 wt % of 2T, 12 wt % of the photopolymerizable monomer, 0.5 wt % of the photoinitiator, and 10 wt % of the metal oxide fine particle. The total solid content is about 25%.

(2) Preparation of a pattern of a quantum dot polymer composite and a thermal treatment thereof The photosensitive composition obtained as above is spin-coated on a glass substrate at 150 revolutions per minute (rpm) for 5 seconds (s) to provide a film. The obtained film is pre-baked at 100° C. (PRB). The pre-baked film is exposed to light (wavelength: 365 nanometers (nm), intensity: 100 millijoules, mJ) under a mask having a predetermined pattern (e.g., a square dot or stripe pattern) for 1 s (EXP) and developed with a potassium hydroxide aqueous solution (conc.: 0.043%) for 50 seconds to obtain a pattern of a quantum dot polymer composite (thickness: 6 micrometers (μm)).

The obtained pattern is heat-treated at a temperature of 180° C. for 30 minutes under a nitrogen atmosphere. (POB)

For the obtained pattern film, a luminous efficiency of a pattern and maintenance of light emission after FOB (i.e., in comparison with the PRB) are measured and the results are shown in Table 5.

Comparative Example 4

A quantum dot polymer composite pattern is prepared in the same manner as in Example 4 except for using the core-shell quantum dots prepared in Comparative Example 2 instead of the quantum dots of Example 2.

TABLE 5

|  | Conversion Efficiency of pattern (%) | maintenance of light emission after a heat treatment (%) |
|---|---|---|
| Example 4 | 24 | 89 |
| Comparative Example 4 | 28 | 95 |

The results of Table 5 confirm that the quantum dots of Example 2 have greatly improved stability in comparison with the quantum dots of Comparative Example 2.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A quantum dot comprising a core comprising a quaternary alloy semiconductor nanocrystal,
    wherein the quantum dot does not comprise cadmium,
    wherein the quaternary alloy semiconductor nanocrystal comprises indium, phosphorous, zinc, and selenium, in the core, a ratio of the zinc with respect to the indium is less than or equal to about 0.5:1 and in the core, a ratio of selenium with respect to zinc is less than or equal to about 0.6:1.

2. The quantum dot of claim 1, wherein in the core, the ratio of zinc with respect to indium is less than or equal to about 0.45:1 and in the core, and the ratio of selenium with respect to zinc is less than or equal to about 0.51:1.

3. The quantum dot of claim 1, wherein the core has a first absorption peak wavelength of less than or equal to about 460 nanometers in an ultraviolet-visible absorption spectrum of the core.

4. The quantum dot of claim 1, wherein the quaternary alloy semiconductor nanocrystal comprises a homogeneous alloy.

5. The quantum dot of claim 1, wherein the core has a size of greater than or equal to about 2 nanometers.

6. The quantum dot of claim 1, wherein in the core, a mole ratio of a total sum of the zinc and the selenium with respect to a total sum the indium and the phosphorous is greater than or equal to about 0.2:1 and less than or equal to about 0.65:1.

7. The quantum dot of claim 1, wherein the quantum dot has a semiconductor nanocrystal shell on the core and the semiconductor nanocrystal shell comprises zinc, selenium, and sulfur.

8. The quantum dot of claim 1, wherein the semiconductor nanocrystal shell comprises a first layer disposed directly on the core and a second layer disposed on the first layer, the first layer comprising a first semiconductor nanocrystal, and the second layer comprising a second semiconductor nanocrystal having a composition different from a composition of the first semiconductor nanocrystal.

9. The quantum dot of claim 8, wherein an energy bandgap of the second semiconductor nanocrystal is greater than or equal to an energy bandgap of the first semiconductor nanocrystal.

10. The quantum dot of claim 8, wherein the first semiconductor nanocrystal comprises zinc, selenium, and optionally sulfur, and the second semiconductor nanocrystal comprises zinc and sulfur and does not comprise selenium.

11. The quantum dot of claim 8, wherein a thickness of the first layer is greater than or equal to about 3 monolayers and less than or equal to about 10 monolayers.

12. The quantum dot of claim 8, wherein the second layer is an outermost layer of the quantum dot.

13. The quantum dot of claim 8, wherein a thickness of the second layer is greater than or equal to about 1 monolayer and less than or equal to about 10 monolayers.

14. The quantum dot of claim 7, wherein a maximum photoluminescence peak of the quantum dot is in a range of from about 500 nanometers to about 580 nanometers.

15. The quantum dot of claim 7, wherein a maximum photoluminescence peak of the quantum dot has a full width at half maximum of less than or equal to about 45 nanometers.

16. The quantum dot of claim 7, wherein a quantum efficiency of the quantum dots is greater than or equal to about 70%.

17. A method of producing a quantum dot of claim 1, which comprises:
    preparing a reaction liquid comprising an organic ligand, an indium precursor, a zinc precursor, a selenium precursor, and a phosphorous precursor in an organic solvent; and
    conducting a reaction in the reaction liquid at a temperature of about greater than or equal to about 290° C. for a time period of less than or equal to about 1 hour to obtain a core comprising a quaternary alloy semiconductor nanocrystal.

18. The method of claim 17, wherein preparing the reaction liquid comprises mixing the indium precursor and the zinc precursor in the organic solvent in the presence of the organic ligand to obtain a mixture; heating the mixture at a temperature of about 150° C. and 220° C. to obtain a heated mixture; and adding the selenium precursor and the phosphorous precursor to the heated mixture.

19. The method of claim 17, wherein the reaction liquid does not comprise an alkyl thiol.

20. A composition, comprising:
    the quantum dot of claim 1,
    a dispersing agent for the quantum dot,
    a polymerizable monomer comprising a carbon-carbon double bond;
    a photoinitiator, and
    a solvent.

21. The composition of claim 20, wherein the dispersing agent comprises a carboxylic acid group containing binder polymer, and
    the carboxylic acid group containing binder polymer comprises:
    a copolymer of a monomer mixture comprising a first monomer comprising a carboxylic acid group and a carbon-carbon double bond, a second monomer comprising a carbon-carbon double bond and a hydrophobic moiety and not comprising a carboxylic acid group, and optionally a third monomer comprising a carbon-carbon double bond and a hydrophilic moiety and not comprising a carboxylic acid group;
    a multiple aromatic ring-containing polymer having a backbone structure in which two aromatic rings are bound to a quaternary carbon atom that is a constituent atom of another cyclic moiety in a main chain of the backbone structure, the multiple aromatic ring-containing polymer comprising a carboxylic acid group (—COOH); or
a combination thereof.

22. The composition of claim 21, wherein the carboxylic acid containing binder polymer has an acid value of greater than or equal to about 50 milligrams of potassium hydroxide per gram and less than or equal to about 240 milligrams of potassium hydroxide per gram.

23. The composition of claim 21, wherein the composition further comprises a thiol compound including a thiol group at a terminal end of the thiol compound, a metal oxide fine particle, or a combination thereof.

24. The composition of claim 23, wherein
the metal oxide fine particles comprises $TiO_2$, $SiO_2$, $BaTiO_3$, $Ba_2TiO_4$, ZnO, or a combination thereof, and
wherein the thiol compound comprises a compound represented by Chemical Formula 1:

Chemical Formula 1

wherein,
$R^1$ is hydrogen; a substituted or unsubstituted C1 to C30 linear or branched alkyl group; a substituted or unsubstituted C6 to C30 aryl group; a substituted or unsubstituted C3 to C30 heteroaryl group; a substituted or unsubstituted C3 to C30 cycloalkyl group; a substituted or unsubstituted C3 to C30 heterocycloalkyl group; a C1 to C10 alkoxy group; a hydroxy group; —$NH_2$; a substituted or unsubstituted C1 to C30 amine group, wherein —NRR', wherein R and R' are independently hydrogen or C1 to C30 linear or branched alkyl group, but simultaneously not hydrogen; an isocyanate group; a halogen; —ROR', wherein R is a substituted or unsubstituted C1 to C20 alkylene group and R' is hydrogen or a C1 to C20 linear or branched alkyl group; an acyl halide, wherein —RC(=O)X, wherein R is a substituted or unsubstituted alkylene group and X is a halogen; —C(=O)OR', wherein R' is hydrogen or a C1 to C20 linear or branched alkyl group; —CN; —C(=O)NRR', wherein R and R' are independently hydrogen or a C1 to C20 linear or branched alkyl group; —C(=O)ONRR', wherein R and R' are independently hydrogen or a C1 to C20 linear or branched alkyl group; or a combination thereof,
$L_1$ is a carbon atom, a substituted or unsubstituted C1 to C30 alkylene group, a substituted or unsubstituted C1 to C30 alkylene group wherein a methylene is replaced by a sulfonyl moiety, a carbonyl moiety, an ether moiety, a sulfide moiety, a sulfoxide moiety, an ester moiety, an amide moiety comprising hydrogen or a C1 to C10 alkyl group, or a combination thereof, a substituted or unsubstituted C3 to C30 cycloalkylene group, a substituted or unsubstituted C6 to C30 arylene group, a substituted or unsubstituted C3 to C30 heteroarylene group, or a substituted or unsubstituted C3 to C30 heterocycloalkylene group,
$Y_1$ is a single bond; a substituted or unsubstituted C1 to C30 alkylene group; a substituted or unsubstituted C2 to C30 alkenylene group; or a substituted or unsubstituted C1 to C30 alkylene group or a substituted or unsubstituted C2 to C30 alkenylene group wherein a methylene is replaced by a sulfonyl moiety, a carbonyl moiety, an ether moiety, a sulfide moiety, a sulfoxide moiety, an ester moiety, an amide moiety comprising hydrogen or a C1 to C10 linear or branched alkyl group, an imine moiety comprising hydrogen or a C1 to C10 linear or branched alkyl group, or a combination thereof,
m is an integer of 1 or greater,
k1 is 0 or an integer of 1 or greater, k2 is an integer of 1 or greater, and
a sum of m and k2 is an integer of 3 or greater,
provided that m does not exceed the valence of $Y_1$ and a sum of k1 and k2 does not exceed the valence of $L_1$.

25. A quantum dot-polymer composite comprising:
a polymer matrix; and
the quantum dot of claim 1 in the polymer matrix.

26. The quantum dot-polymer composite of claim 25, wherein the polymer matrix comprises a crosslinked polymer, a binder polymer comprising a carboxylic acid group, or a combination thereof.

27. The quantum dot-polymer composite of claim 25, wherein the polymer matrix comprises a binder polymer comprising a carboxylic acid group, a polymerization product of a photopolymerizable monomer comprising at least carbon-carbon double bond, a polymerization product of the photopolymerizable monomer and a multi-thiol compound including at least two thiol groups at its terminal end, or a combination thereof.

28. A display device, comprising
a light source and a light emitting element,
wherein the light emitting element comprises the quantum dot-polymer composite of claim 25 and the light source is configured to provide the light emitting element with incident light.

29. The display device of claim 28, wherein the incident light has a luminescence peak wavelength of about 440 nanometers to about 460 nanometers.

30. The display device of claim 28, wherein, the light emitting element comprises a sheet comprising the quantum dot polymer composite.

31. The display device of claim 28, wherein the light emitting element comprises a stacked structure comprising a substrate and a light emitting layer disposed on the substrate,
wherein the light emitting layer comprises a pattern of the quantum dot polymer composite and the pattern comprises a repeating section configured to emit light at a predetermined wavelength.

32. The display device of claim 31, wherein the pattern comprises a first section configured to emit first light and a second section configured to emit a second light having a center wavelength that is different from a center wavelength of the first light.

* * * * *